United States Patent [19]

Lau

[11] Patent Number: 4,826,439

[45] Date of Patent: May 2, 1989

[54] SELF-LATCHING LAMP JACK

[75] Inventor: Frederick L. Lau, Skokie, Ill.

[73] Assignee: Switchcraft, Inc., Chicago, Ill.

[21] Appl. No.: 20,817

[22] Filed: Mar. 2, 1987

[51] Int. Cl.4 .......... H05K 1/00

[52] U.S. Cl. .......... 439/56; 439/79; 439/752; 439/731; 439/696

[58] Field of Search .......... 439/55, 79, 356, 360, 439/695, 696, 699, 701, 712, 714, 715, 724, 731, 752, 56

[56] References Cited

U.S. PATENT DOCUMENTS

| | | | |
|---|---|---|---|
| 2,946,994 | 7/1960 | Dumke et al. | 340/381 |
| 3,001,165 | 9/1961 | Woofter et al. | 339/17 |
| 3,611,360 | 10/1971 | Bailey | 340/381 |
| 3,818,486 | 6/1974 | Bailey | 340/381 R |
| 3,820,055 | 6/1974 | Huffnagel et al. | 339/17 F |
| 4,184,734 | 1/1980 | Toorell | 439/731 |
| 4,372,634 | 2/1983 | Ritchie et al. | 439/696 |
| 4,387,950 | 6/1987 | Guzik et al. | 439/752 |
| 4,402,110 | 9/1983 | Savage, Jr. | 439/752 |
| 4,408,820 | 10/1983 | Eaby et al. | 439/696 |
| 4,410,225 | 10/1983 | Stoewe et al. | 439/696 |
| 4,737,113 | 4/1988 | Hopper et al. | 439/752 |

FOREIGN PATENT DOCUMENTS

| | | | |
|---|---|---|---|
| 1465264 | 5/1969 | Fed. Rep. of Germany | 439/696 |

*Primary Examiner*—David Pirlot
*Attorney, Agent, or Firm*—William R. Clark; John T. Meaney; Richard M. Sharkansky

[57] ABSTRACT

A self-latching lamp jack comprising first and second dielectric plates disposed in opposing relationship for forming respective opposing sides of the lamp jack. One of the opposing plates is provided with a plurality of interposed wall portions for forming a pair of lamp conductor receiving cavities adjacent one end of the lamp jack. Also, the self-latching lamp jack includes a pair of electrical contact members which are blade-like and are disposed edge-wise between the opposing dielectric plates. Each of the contact members has an end portion disposed in a respective one of the lamp conductors receiving cavities and a midportion provided with a pair of laterally extended tabs which protrude into respectively aligned slots in the plates. The contact members have opposing terminal end portions which extend out of another end portion of the lamp jack. The first and second dielectric plates have respective first and second integral latching devices which cooperate with one another for removably securing the plates to one another and locking the contact members between the plates.

8 Claims, 18 Drawing Sheets

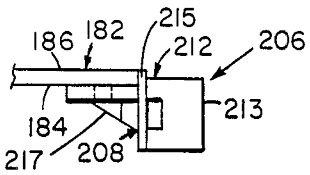
FIG. 13C
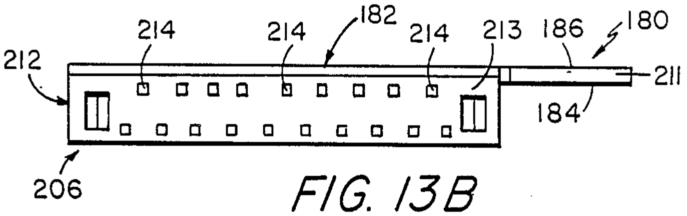
FIG. 13B
FIG. 13D
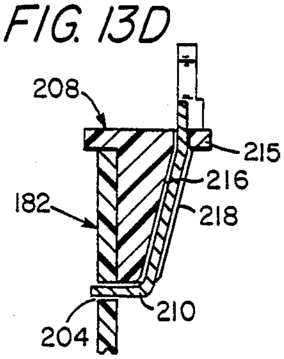
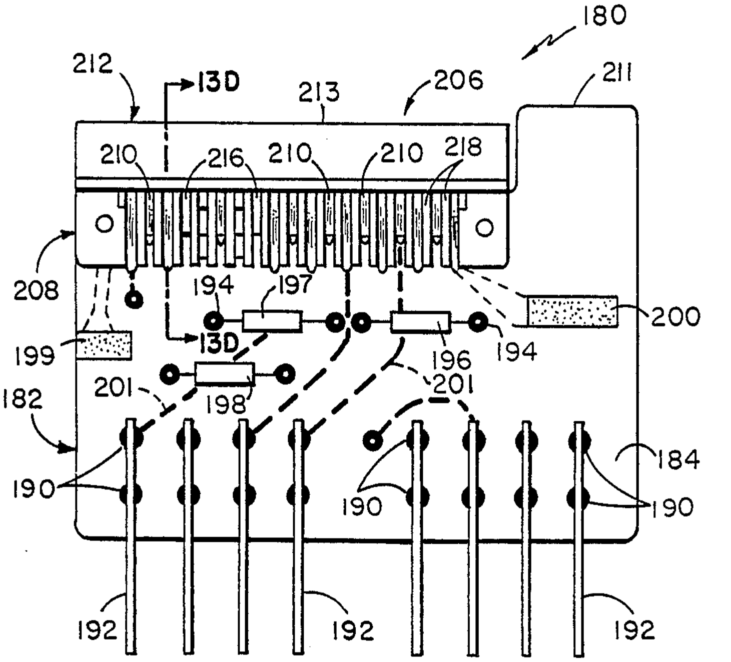
FIG. 13
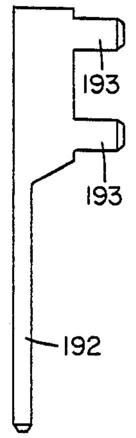
FIG. 13E
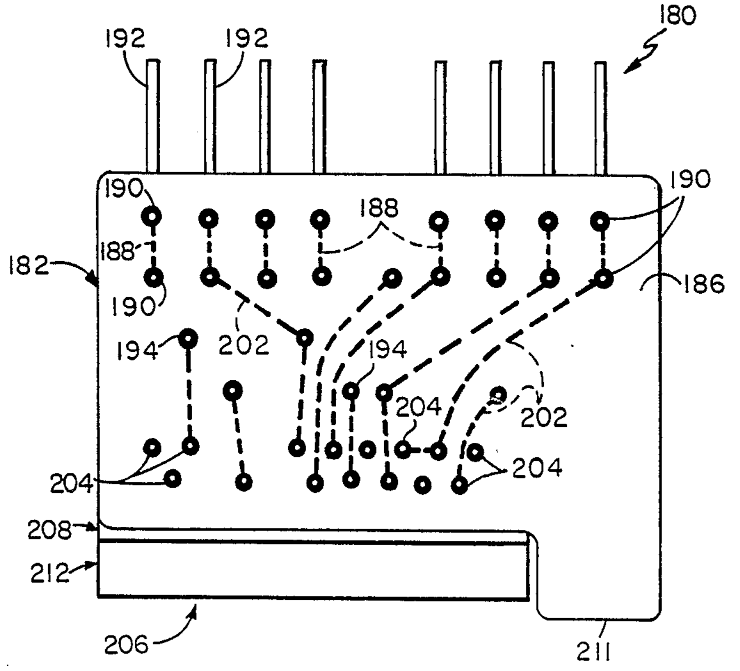
FIG. 13A

SELF-LATCHING LAMP JACK

BACKGROUND OF THE INVENTION

1. Field of the Invention

This invention relates generally to lamp jacks wherein terminal wire of lamps may be inserted and is concerned more particularly with a self-latching lamp jack which is readily assembled and adaptable for use in a printed circuit board assembly.

2. Discussion of the Prior Art

A jackfield assembly of the prior art may include a rectangular frame defining an opening wherein a linear array of laterally spaced, electrical jack modules extends in cantilever fashion from a supporting longitudinal side of the frame. Each of the modules in the linear array has a respective portion secured to the supporting longitudinal side of the frame which generally comprises the front side of the assembly. Also, each of the modules has extended from another portion thereof a plurality of mutually spaced terminals which are electrically connected, as by wire-wrapping, for example, to respective electrical conductors. The conductors are connected electrically to respective feedthrough terminals of electrical connectors mounted in the opposing longitudinal side of the frame which generally constitutes the rear side of the assembly.

There may be disposed in spaced alignment above each of the modules in the linear array a respective indicator lamp having a pair of semi-rigid terminal conductors inserted into a respective jack. The lamp jacks generally have respective proximal end portions secured, as by respective screws, for example, to the adjacent longitudinal side of the frame and extend therefrom in cantilever fashion into the opening defined by the rectangular frame. Each of the lamp jacks may comprise a dielectric body having secured thereto, as by rivets, for example, a pair of mutually insulated contact members. The contact members of each lamp jack centrally have contacting end portions disposed adjacent the proximal end portion thereof for electrical engagement with the respective terminal conductors of the installed indicator lamp. Also, the contact members of each lamp jack generally have opposing terminal end portions extended from the distal end portion thereof for electrical connection, as by wire-wrapping, for example, to respective conductors in the opening defined by the frame.

Thus, when removal of a particular lamp jack is required, it is necessary to disconnect the wire conductors from the terminal end portions of the contact members and to unfasten the proximal end portion of the lamp jack from the supporting longitudinal side of the frame. Further, if removal of one or both contact members from the dielectric body of the lamp jack is required, as for replacement, for example, it is necessary to disengage the securing rivets and to re-assemble by installing new rivets. Consequently, removal and securing of a lamp jack from the jackfield can be very time consuming and cost prohibitive.

SUMMARY OF THE INVENTION

Accordingly, these and other disadvantages of the prior art are overcome by this invention providing a self-latching lamp jack which may be readily disassembled and re-assembled without regard to extraneous fastening devices. The self-latching lamp jack comprises a pair of dielectric plates having respective integral latching means for removably securing the plates to one another and forming a pair of lamp conductor receiving cavities adjacent one end of the lamp jack. Also, the self-latching lamp jack includes a pair of electrical contact means secured in operative relationship with one another and having end portions disposed in a respective one of the lamp conductor receiving cavities.

The pair of dielectric plates are disposed in opposing relationship with respective inner surfaces adjacent one another and respective opposing outer surfaces constituting outer surfaces of the lamp jack. One of the opposing plates is provided with a plurality of interposed wall portions having respective projecting means cooperating with aligned portions of the other one of the plates for maintaining the plates in predetermined positional relationship with one another. Also, the plurality of interposed wall portions have respective end portion means disposed for forming the pair of lamp conductor receiving cavities adjacent one end of the lamp jack.

A first one of the opposing plates has a plurality of mutually spaced portions wherein respective through-apertures extend from the inner surface to the outer surface of the first plate. Each of the through-apertures has disposed therein a ramp-like projection of the first plate having a sloped cam surface directed toward the inner surface thereof and a terminating sheer end surface directed toward the outer surface of the first plate. The second one of the opposing plates has extended integrally from the inner surface thereof a plurality of flexible legs which are aligned with respective ramp-like projections of the first plate. Each of the flexible legs has a tapered distal end portion disposed for rubbing engagement with the sloped surface of the aligned ramp-like projection and terminated in shoulder means for latchingly engaging the sheer end surface of the aligned ramp-like projection.

The pair of electrical contact means comprises first and second blade-like contact members disposed edgewise between the opposing dielectric plates. Each of the contact members has a midportion with opposing side edges from which extend respective coplanar tab means for protruding into respective slots provided in aligned portions of the opposing plates. Also, each of the contact members has a terminal end portion extended from between other end portions of the opposing plates and externally thereof. The externally extending terminal end portions may be provided with respective projecting means for protruding into respective conductive holes in a printed circuit board assembly.

BRIEF DESCRIPTION OF THE DRAWINGS

For a better understanding of the inventive subject matter disclosed herein, reference is made in the following more detailed description to the accompanying drawings wherein:

FIG. 13 is a plan view of one broad surface of the printed circuit sub-assembly embodying the novel connector features of this disclosure;

FIG. 13A is a plan view of the other broad surface of the printed circuit sub-assembly shown in FIG. 13;

FIG. 13B is an elevational end view of the printed circuit sub-assembly shown in FIG. 13;

FIG. 13C is a fragmentary elevational side view of the printed circuit sub-assembly shown in FIG. 13;

FIG. 13D is a fragmentary sectional view taken along the line 13D—13D shown in FIG. 13 and looking in the direction of the arrows;

FIG. 13E is an elevational side view of a terminal lug shown in FIG. 13;

FIG. 23B is an enlarged schematic view showing a printed circuit board of a subassembly disposed for sliding into respective aligned grooves of opposing wafer guides shown in FIG. 23A;

DESCRIPTION OF THE PREFERRED EMBODIMENTS

Figure 1A:
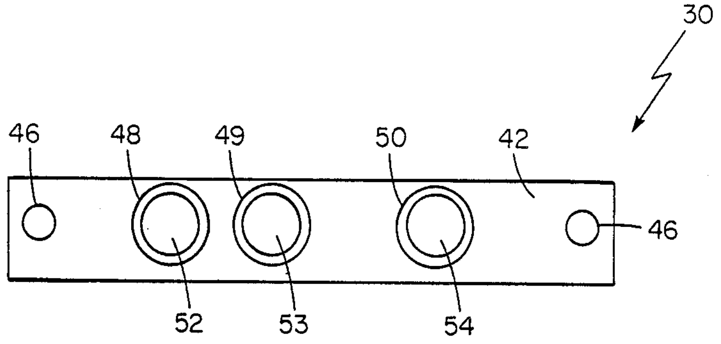
FIG. 1A is an elevational view of one end of the module shown in FIG. 1.

Referring to the drawings wherein like characters of reference designate like parts, there is shown in FIG. 1 and FIGS. 1A-1C an electrical jack module 30 provided with a slab-like body comprising a shallow box-like housing 32 having a broad open side which is substantially closed by a ground plane cover 34. The housing 32 is made of rigid dielectric material, such as molded plastic material, for example and the cover 34 is made of resilient electrically conductive material, such as nickel alloy sheet material, for example. Housing 32 has opposite its broad open side a similarly broad side wall 36 which has opposing edge portions integrally joined to relatively narrow side walls, 38 and 40, respectively. The walls 36, 38 and 40 also are integrally joined to one end portion of housing 32 comprising a mounting bracket 42, and to an opposing terminal mounting end portion 44 of the housing 32. Thus, the opposing narrow side walls 38 and 40, respectively, and the opposing end portions 42 and 44, respectively, define the open side of housing 32 comprising access means for readily assembling components of module 30 within housing 32.

The mounting bracket 42 of housing 32 has opposing end portions extended slightly beyond the narrow side walls 38 and 40, respectively, are provided with respective mounting holes 46 which extend through the thicknesses of the bracket end portions. Protruding outwardly from the outer surface of mounting bracket 42 is a linear series of mutually spaced collars, 48, 49 and 50, respectively, which extend integrally through the bracket 42 and terminate within the housing 32. Each of the collars 48, 49 and 50 defines a respective plug-receiving aperture 52, 53 and 54, respectively, which is aligned with a respective electrical jack 56, 57 and 58 of a coplanar, mutually spaced series disposed within housing 32. Thus, it may be seen that when the housing 32 is oriented such that one of the narrow side walls 38 and 40, respectively, is lowermost and the other is uppermost, the respective electrical jacks 56, 57 and 58 are disposed in a stacked series.

The electrical jack 56 comprises a ring actuated contact member 60, which is disposed in normally closed or contacting relationship with a first stationary contact member 62, and a tip actuated contact member 64, which is disposed in normally closed or contacting relationship with a second stationary contact member 62. Also, the electrical jack 57 comprises a second ring actuated contact member 60, which is disposed in normally closed or contacting relationship with a third stationary contact member 62, and a second tip actuated contact member 64, which is disposed in normally closed or contacting relationship with a fourth stationary contact member 62. Moreover, the electrical jack 58 comprises a third ring actuated contact member 60 and a third tip actuated contact member 64, both of which are optionally not disposed in electrically operative relationship with any stationary contact members. Alternatively, however, respective stationary contact members similar to the contact members 62 may be disposed in operative switch relationship with the respective ring and tip actuated contact members 60 and 64 of electrical jack 58, if desired.

Adjacent the inner end portions of collars 48, 49 and 50, there is integrally molded in housing 32 respective mesa-like portions 66 which have disposed therein respective hinge sockets 68. Each of the sockets 68 has an open end adjacent the cover 34 and has an axial wall opening directed toward the interior of housing 32. Slidably inserted into the open ends of sockets 68 adjacent the collars 48 and 50 are small diameter end portions 69 of respective barbell-like lifters 70 which are made of rigid dielectric material, such as molded plastic material, for example. Intermediate bar-like portions 71 of the lifters 70 extend through the axial wall openings of the respectively supporting sockets 68 and terminate in respective larger diameter end portions 72. The larger diameter end portion 72 of the lifter 70 adjacent collar 48 comprises dielectric spacer means disposed between the ring actuated contact member 60 of electrical jack 56 and a movable contact member 74 of a normally open switch 76. The larger diameter end portion 72 of the lifter 70 adjacent collar 50 comprises dielectric spacer means disposed between the ring actuated contact member 60 of electrical jack 58 and a movable contact member 74 of a normally open switch 78.

The sockets 68 rotatably support the smaller diameter end portions 69 of lifters 70 and have axial wall openings of suitable width for permitting the intermediate bar-like portions 71 of lifters 70 and the larger diameter end portions thereof to move arcuately in the plane defined by the sockets 68. Accordingly, when the ring actuated contact members 60 of electrical jacks 56 and 58 are actuated, the contact members 60 are bent resiliently away from the normally engaged stationary contact members 62. As a result, the ring actuated contact members 60 of electrical jacks 56 and 58 press laterally against the adjacent large diameter end portions 72 of the lifters 70 thereby causing the small diameter end portions 69 of lifter 70 to rotate in the supporting sockets 68. Consequently, the larger diameter end portions 72 of lifters 72 move arcuately and press laterally against the adjacent movable contact members 74 of switches 76 and 78, respectively. Thus, with regard to switch 76, the contact member 74 thereof is pressed into contacting relationship with a fifth stationary contact members 62; and with regard to switch 78, the contact member 74 thereof is pressed into contacting relationship with a sixth stationary contact member 62. As shown by the unoccupied socket 68 adjacent collar 49, the dielectric lifter 70 need not be installed in the socket 68 when not required.

Therefore, to form the three electrical jacks 56–58 and two normally open switches 76 and 78 only three ring actuated contact members 60, three tip actuated contact members 64, two movable contact members 74 and six stationary contact members 62 are required for a total of fourteen contact members. The fourteen contact members are retained in position in the terminal mounting end portion 44 of housing 32 by a contact retainer bar 80 made of dielectric material, such as molded plastic material, for example. Depending integrally from opposing longitudinal sides of the bar 80 are respective pluralities of flexible latching legs 82. As shown in FIG. 1D, each of the legs 82 is aligned with a respective ramp portion 84 molded integrally on the terminal mounting end portion 44 of housing 32. Thus, the legs 82 deflect resiliently to travel along the sloped surfaces of aligned ramp portions 84 and spring resiliently back into latching relationship with the sheer end surfaces of ramp portions 84 to secure the bar 80 removably to the terminal mounting end portion 44 of housing 32. As a result, the fourteen contact members are held precisely in position and have respective integral terminal end portions 86 protruding from the terminal mounting end portion 44 of housing 32. As shown in FIG. 1C, the protruding terminal end portions 86 are disposed in staggered relationship with adjacent terminal end portions 86 in a linear array 88 thereof.

The dielectric lifters 70 are retained in the supporting sockets 68 by the cover 34 which is disposed over the open side of housing 32 including the contact retainer bar 80 secured to the terminal end portion 44 of housing 32. Depending integrally from opposing side edge portions of the cover 34 are respective resilient latching tangs 90 and 92, respectively. As shown in FIGS. 1E and 1F, the latching tangs 90 and 92 deflect resiliently to travel along the sloped surfaces of respective ramp portions 94 molded integrally on the opposing narrow side walls 38 and 40 of housing 32. The tangs 90 and 92 drop off respective sheer ends of the ramp portions 94 and spring resiliently back into latching relationship with the sheer end surfaces of ramp portions 94. Also, adjacent each of the mesa-like portions 66 of housing 32, the cover 34, as shown in FIG. 1G, is provided with respective integral latching tangs 96. The tangs 96 deflect resiliently to travel along sloped surfaces of respective ramp portions 98 molded integrally on the mesa-like portions 66 and spring resiliently back into latching relationship with the sheer end surfaces of the ramp-like portions 98. Thus, the respective tangs 90, 92 and 96 secure the cover 34 removably to the housing 32.

Also, extending integrally from portions of the cover 34 adjacent the collars 48, 49 and 50 are respective sleeve grounding contact 99. The sleeve grounding contacts 99 have curved distal end portions disposed in alignment with the respective plug-receiving apertures 52, 53 and 54 for cooperating with the tip actuated contact members 64 and the ring actuated contact members 60 of the aligned electrical jacks 56, 57 and 58, respectively. Moreover, the side edge of cover 34 having depending therefrom the latching tang 90 also has depending therefrom an integral portion from which an electrical grounding terminal 100 extends into position in the linear array 88 of staggered terminal end portions 86. Thus, the cover 34 is provided with means to function as an electrical ground plane for directing electrical signals to electrical ground and shielding the module 30 from spurious electrical signals commonly referred to as "cross-talk".

Figure 1:
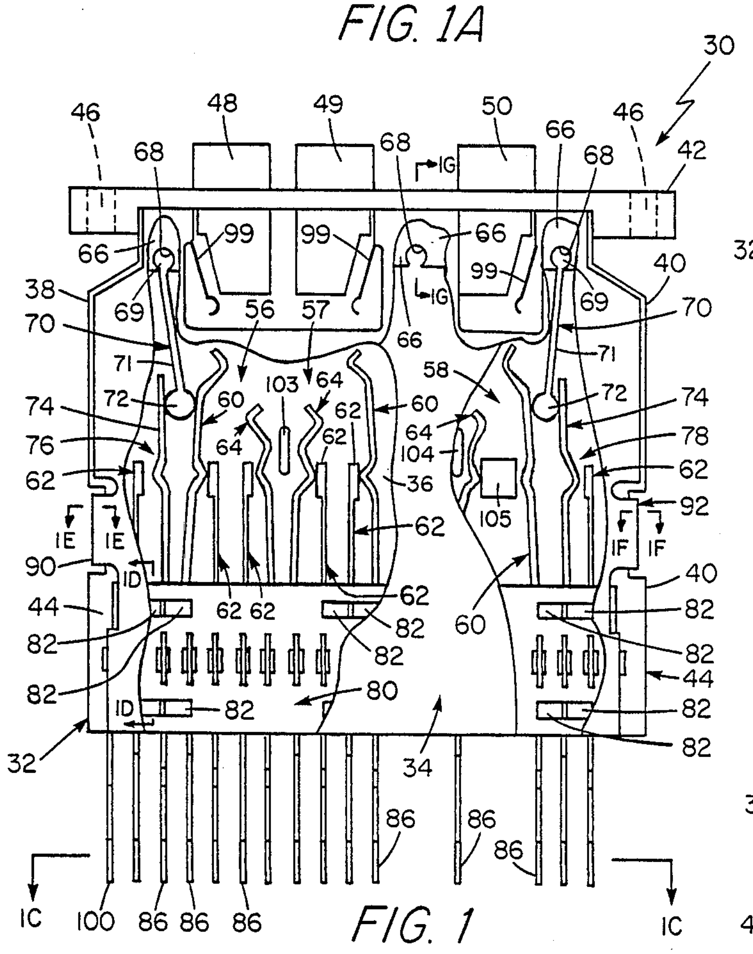
FIG. 1 is a plan view, partly fragmentary, of an electrical jack module embodying the novel module features of this disclosure.
Figure 1E:
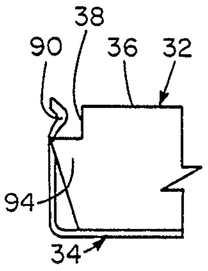
FIG. 1E is a sectional view taken along the line 1E—1E shown in FIG. 1 and looking in the direction of the arrows.
Figure 1G:
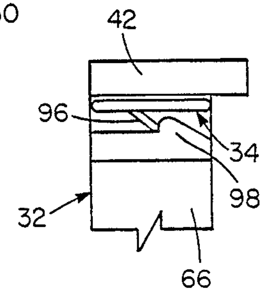
FIG. 1G is a sectional view taken along the line 1G—1G shown in FIG. 1 and looking in the direction of the arrows.
Figure 1F:
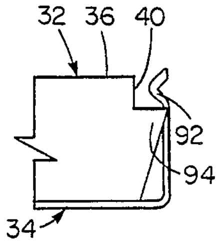
FIG. 1F is a sectional view taken along the line 1F—1F shown in FIG. 1 and looking in the direction of the arrows.
Figure 1D:
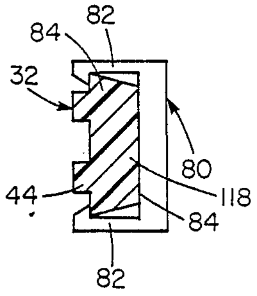
FIG. 1D is a sectional view taken along the line 1D—1D shown in FIG. 1 and looking in the direction of the arrows.
Figure 1C:
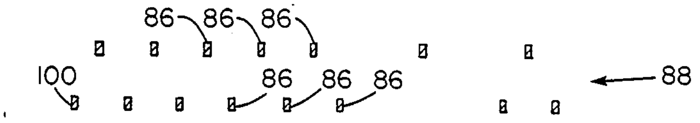
FIG. 1C is a cross-sectional view taken along the line 1C—1C shown in FIG. 1 and looking in the directioyn of the arrows.
Figure 1B:
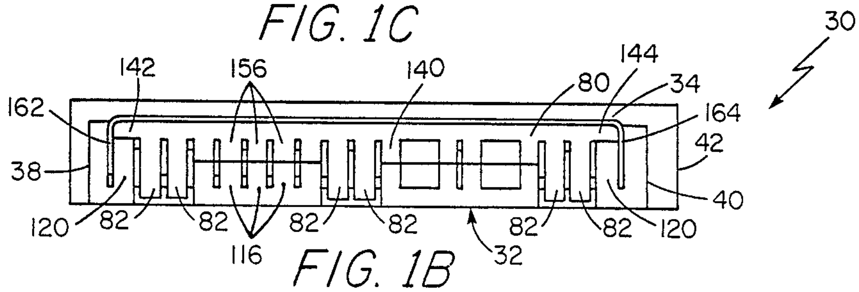
FIG. 1B is an elevational view of the other end of the module shown in FIG. 1.
Figure 2G:
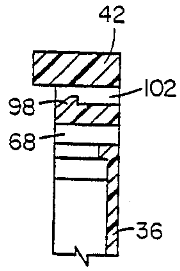
FIG. 2G is a sectional view taken along the respective lines 2G—2G . shown in FIG. 2 (3 places) and looking in the direction of the arrows.
Figure 2A:
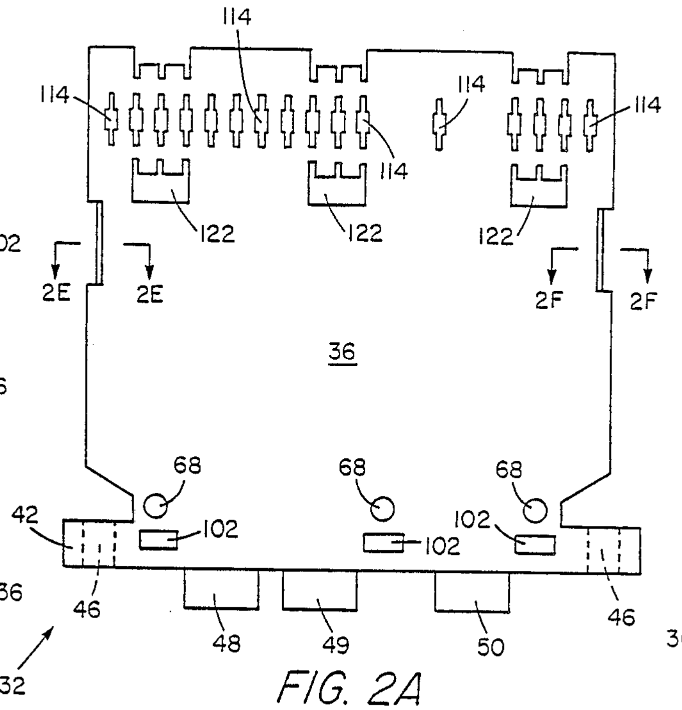
FIG. 2A is a plan view of the broad closed side of the housing shown in FIG. 2.

As shown in FIG. 2 and 2A–2C, the housing 32 has maximum width and thickness dimensions determined by the corresponding dimensions of the mounting bracket 42, which also determines the maximum width and thickness dimensions of the module 30 shown in FIGS. 1 and 1A–1B. The outer surface of mounting bracket 42 is substantially flat except for the collars 48, 49 and 50, respectively, protruding outwardly therefrom. The narrow side walls 38 and 40 of housing 32 have portions adjacent respective end portions of the mounting bracket 42 angled inwardly toward one another. As a result, there is provided behind the end portions of bracket 42 respective clearance spaces for fastening hardware (not shown) associated with the mounting holes 46 extended through the end portions of bracket 42. The portions of narrow side walls 38 and 40 extending from the their angled end portions to the terminal mounting end portion 44 of housing 32 are substantially flat except for respective recesses having therein the ramp portions 94 shown in FIGS. 1E and 1F, respectively. As shown in FIGS. 2E and 2F, the respective ramp portions 94 slope from the open side of housing 32 and outwardly thereof to terminate in respective sheer end surfaces of the ramp portions 94 which are spaced from the wall 36.

The respective mesa-like portions 66 of housing 32 adjacent the collars 48, 49 and 50 have side surfaces spaced from the inner surface of bracket 42 and have integrally molded thereon the respective ramp-like portions 98 shown in FIG. 1G. As shown in FIG. 2G, the ramp-like portions 98 slope outwardly from the surfaces of mesa-like portions 66 adjacent the open side of housing 32 and terminate in respective sheer end surfaces of the ramp-like portions 98 which are spaced from the side wall 36. Portions of side wall 36 between the ramp-like portions 66 and the inner surface of bracket 42 have disposed therein respective rectangular through-holes 102. The through-holes 02 provide access means for unlatching the resilient tangs 96 shown in Fig. 1G from the sheer end surfaces of ramp-like portions 98 to permit removal of the cover 34 from the open side of housing 32.

The sockets 68 disposed in mesa-like portions 66 also may be extended through the side wall 36 to provide access means for pushing the smaller diameter end portions 69 of dielectric lifters 70 shown in FIG. 1 from the sockets 68 when removal is desired. Alternatively, the sockets 68 may be provided with bottom walls comprising aligned portions of the side wall 36 when more bearing surface area is required for the installed dielectric lifters 70 shown in FIG. 1. In that event, the intermediate bar-like portions 71 of the lifters 70 shown in FIG. 1 may be grasped with a suitable tool, such as tweezers, for example, to withdraw the small diameter end portions 69 of lifters 70 from the engaged sockets 68. Between the inner end portions of collars 48–50 and the terminal mounting end portion 44 of housing 32, the inner surface of side wall 36 is substantially flat except for two rib-like bosses 103 and 104, respectively, and a block-like boss 105 which project integrally from the inner surface of side wall 36. As shown in FIG. 1, the bosses 103 and 104 are disposed for limiting pivotal movements of the tip actuated contact members 64 of electrical jacks 56, 57 and 58, respectively. Furthermore, as shown in FIG. 1, the boss 105 is disposed for insulating the ring actuated contact member 60 from the tip actuated contact member 64 of the electrical jack 58.

The maximum thickness of housing 32 at the terminal mounting end portion 44 thereof is determined by the corresponding dimensions of the adjacent narrow side wall end portions. These end portions of side walls 38 and 40, respectively, extend rectilinearly from the respective recesses having therein the ramp-like portions 94 to the adjacent end of housing 32. Disposed between these end portions of narrow side walls 38 and 40, respectively, is a linear array 106 of substantially parallel grooves 108 and generally rectangular depressions 110 and 112, respectively. Each of the grooves 108 has a bottom wall comprising a respectively aligned portion of side wall 36 which has extended through it a slot 114. Also, each of the grooves 108 and respective underlying slots 114 have aligned central portions which are enlarged laterally to provide them generally rectangular configurations.

The grooves 108 are laterally spaced apart in array 106 by interposed ridge-like projections 116, 118 and 120, respectively, which extend integrally from the inner surface of side wall 36 and terminate in substantially flat surfaces. The flat surfaces of projections 116 have a greater length than the flat surfaces of projections 118, but are disposed at a greater distance from the open side of housing 32 than the flat surfaces of projections 118. However, the flat surfaces of projections 118 are spaced a predetermined distance below the open side of housing 32. The flat surfaces of projections 120 have respective lengths substantially equal to the lengths of the flat surfaces of projections 116 and are disposed substantially flush with the flat surfaces of projections 118.

Figure 2D:
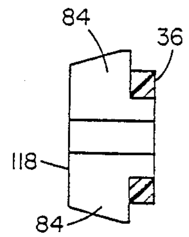
FIG. 2D is a sectional view taken along the respective lines 2D—2D shown in FIG. 2 (3 places) and looking in the direction of the arrows.
Figure 2E:
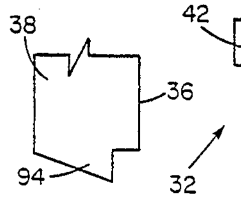
FIG. 2E is a sectional view taken along the line 2E—2E shown in FIG. 2A and looking in the direction of the arrows.
Figure 2F:
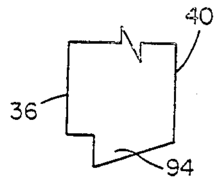
FIG. 2F is a sectional view taken along the line 2F—2F shown in FIG. 2A and looking in the direction of the arrows.
Figure 2B:
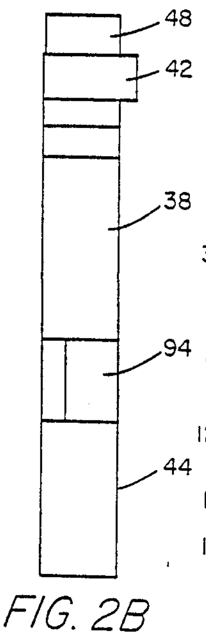
FIG. 2B is an elevational view of one narrow side of the housing shown in FIG. 2.

As shown in FIG. 2D, the projections 118 have end surfaces whereon there is integrally molded respective ramp-like are engaged portions 84 which, as shown in FIGS. 1, 1B and 1D by the flexible legs 82 depending from opposing sides of the contact retainer bar 80. Thus, the ramp-like portions 84 on respective opposing ends of the projections 118 provide means for removably securing the contact retainer bar 80 to the terminal mounting end portion 44 of housing 32. Accordingly, respective pairs of laterally spaced projections 118 are disposed in opposing end portions of the linear array 106 and in the midportion thereof. Aligned with end portions of the pairs of projections 118 adjacent the interior of housing 32 are respective portions of the side wall 36 having therein respective through-apertures 122. The apertures 122 provide access means for disengaging the flexible legs 82 of contact retainer bar 80 shown in FIGS. 1, 1B and 1D from the ramp-like portions 84 on the end surfaces of projections 118 adjacent the interior of housing 32. As shown in FIGS. 1 and 1B, the flexible legs depending from the opposing end surfaces of projections 118 are readily accessible for removal of the contact retainer bar 80 from the terminal mounting end portion of housing 32.

The projections 120 are disposed adjacent the respective end portions of narrow side wall 38 and 40 and are laterally spaced therefrom for forming interposed grooves 108. The projections 120 terminate in respective flat surfaces which are substantially flush with the flat surfaces of projections 118 but have respective lengths substantially egual to the lengths of the flat surfaces terminating the projections 116. The respective grooves 108 disposed between the projections 120 and the end portions of narrow side wall 38 and, 40 receive, therein, as shown in FIGS. 1 and 1B, respective portions 162 and 164 depending from the side edges of cover 34. Since the depending portion 162 of cover 34 received in groove 108 between the end portion of side wall 38 and the adjacent projection 120 has extending integrally therefrom the grounding terminal 100, the grounding terminal 100 comprises an end member of the linear array 88 shown in FIG. C.

The generally rectangular depressions 110 and 112 have adjacent longitudinal sides defined by respective projections 116 which have disposed therebetween a groove 108. The opposing longitudinal sides of depressions 110 and 112 are defined by respective projections 116 which form with adjacent laterally spaced projections 118 respective interposed grooves 108. Also, each of the depressions 110 and 112 have respective ends adjacent the interior of housing 32 defined by respective projections 124 which extend integrally from the inner surface of side wall 36 to terminate in respective flat surfaces spaced predetermined distances below the terminating flat surfaces of projections 116. The opposing ends of depressions 110 and 112 are open and substantially flush with laterally aligned end surfaces of the projections 116 which are substantially flush with the adjacent end surfaces of side walls 38 and 40, respectively.

As shown in FIGS. 3, 4, 5 and 6, the respective contact members 62, 64, 60 and 74 comprise elongated strips of electrically conductive material, such as nickel alloy sheet material, for example, which may be plated with a precious metal, such as silver or gold, for example. Also, the contact members 62, 64, 60 and 74 have respective terminal end portions 86 which are similar to one another and which terminate to one side of the longitudinal centerlines of the strips. Moreover, the contact members 62, 64, 60 and 70 have respective midportions which are similar to one another and are symmetrical with respect to the longitudinal centerlines of the strips. Each of the midportions has a respective pair of blade-like tabs 126 which extend outwardly from opposing longitudinal sides of the contact member. Thus, the four different types of contact members 62, 64, 60 and 70, respectively, differ from one another only in their opposing or contacting end portions.

As shown in FIGS. 3A, 4A, 5A and 6A, the contact members 62, 64, 60 and 74 are provided with suitable thicknesses for enabling their respective contacting end portions to yield or bend resiliently in the direction of their thicknesses when pressed laterally in that direction. The stationary contact member 62 has a contacting end portion terminating with a curved region 128 which is engaged tangentially when contacted by one of the movable contact members 60, 64 and 74, respectively. The tip actuated contact member 64 has a contacting end portion terminating in a plug-engaging rippled region 130 which is spaced from another rippled region 132 of the member 64 suitably disposed for engaging the curved region 28 of a stationary contact member 62. Similarly, the ring actuated contact member 60 has a contacting end portion terminating in a plug-engaging rippled region 134 which is spaced from another rippled region 136 suitably disposed for engaging the curved region 128 of a stationary contact member 62. Also, the contacting end portion of movable contact member 74 has adjacent its distal end a rippled region 138 which is suitably disposed for engaging a curved region 128 of a stationary contact member 62.

Figure 2:
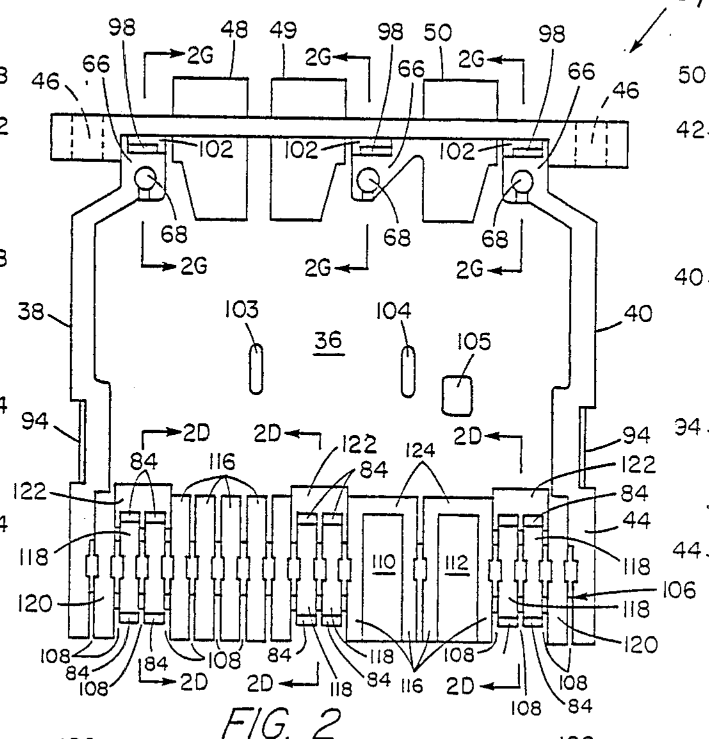
FIG. 2 is a plan view of the broad open side of the housing shown in FIG. 1.
Figure 2C:
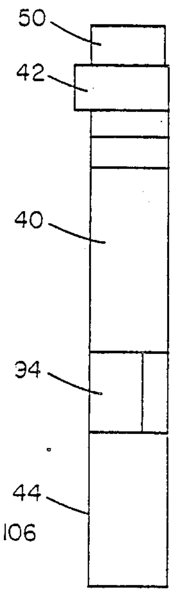
FIG. 2C is an elevational view of the other narrow side of the housing shown in FIG. 2.
Figure 2H:
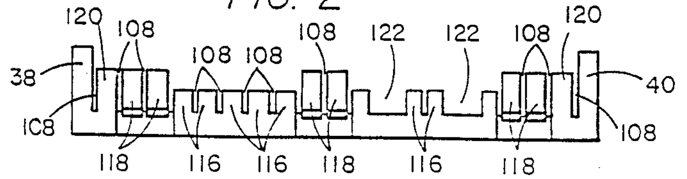
FIG. 2H is an elevational end view of the terminal mounting end portion of the housing shown in FIG. 2.
Figure 6A:
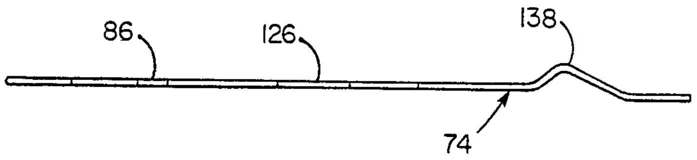
FIG. 6A is a side elevational view of a fourth one of the contact members shown in FIG. 1.
Figure 6:
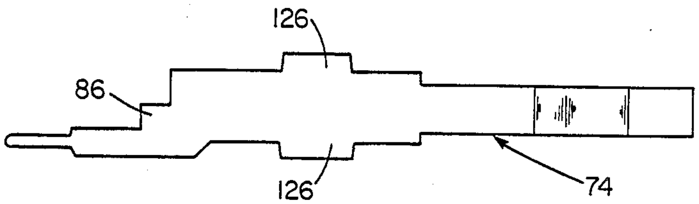
FIG. 6 is a plan view of the contact member shown in FIG. 6A.
Figure 5A:
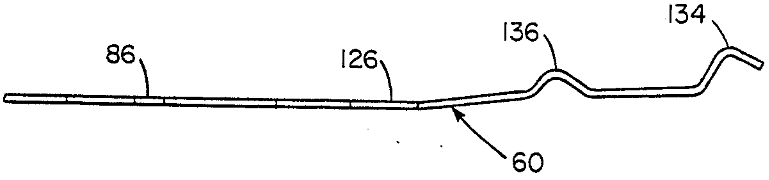
FIG. 5A is a side elevational view of a third one of the contact members shown in FIG. 1.
Figure 5:
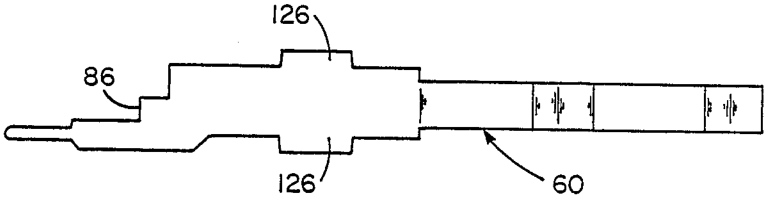
FIG. 5 is a plan view of the contact member shown in FIG. 5A.
Figure 4A:
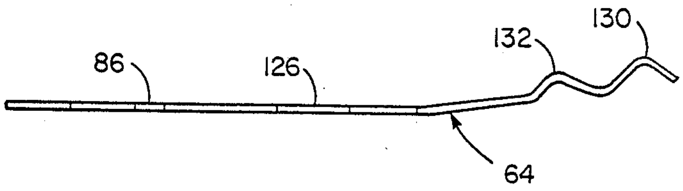
FIG. 4A is a side elevational view of a second one of the contact members shown in FIG. 1.
Figure 4:
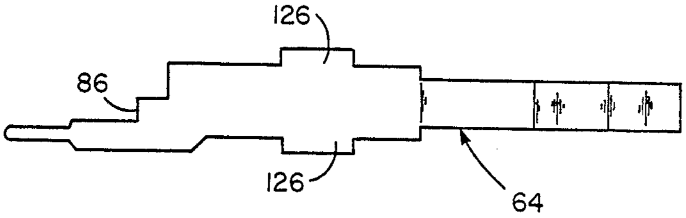
FIG. 4 is a plan view of the contact member shown in FIG. 4A.
Figure 3A:
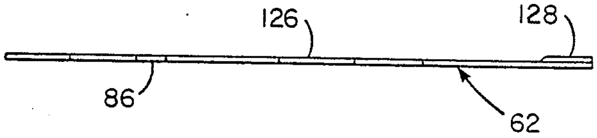
FIG. 3A is a side elevational view of a first one of the contact members shown in FIG. 1.
Figure 3:
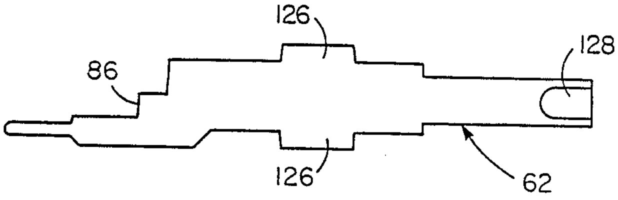
FIG. 3 is a plan view of the contact member shown in FIG. 3A.

Thus, by comparing FIGS. 3–6A with FIGS. 1, 2 and 2H, it may be seen that the midportions of contact members 60, 62, 64 and 74 are inserted edge-wise into respective grooves 108 in the terminal mounting end portion 44 of housing 32. Furthermore, each of the inserted contact members 60, 62, 64 and 74 has a respective one of its blade-like tabs 126 pressed into the aligned slot 114 (FIG. 2A). As a result, the inserted contact members 60, 62, 64 and 74 have their respective contacting end portions accurately located in the interior of housing 32, and have their respective terminal end portions 86 precisely positioned in the linear array 88. Also, as shown in FIGS. 1 and 1C, the inserted contact members 60, 62, 64 and 74 may be reverted relative to respective similar contact members in housing 32, since the midportions of the similar contact members are symmetrical relative to their respective longitudinal centerlines. For example, adjacent stationary contact members 62 in electrical jacks 56 and 57, respectively, are reverted relative to one another. Also, the ring actuated contact members 60 in electrical jacks 56 and 57, respectively, are reverted relative to one another, as well as the tip actuated contact members 64 in electrical jacks 56 and 57, respectively, being reverted relative to one another. As a result, the terminal end portions 86 of adjacent contact members in housing 32 are staggered in the linear array 88 and permit closer linearly spacing while still maintaining a desired insulating spaced relationship therebetween.

As shown in FIG. 7 and 7A–7C, the contact retainer bar 80, which is made of dielectric material, such as molded plastic material, for example, includes a generally rectangular plate 140. The plate 140 has an inner surface where there is disposed between respective end portions 142 and 144 of the plate 140 a linear array 146 of substantially parallel grooves 148 and generally rectangular depressions 150 and 152, respectively, which is similar to the linear array 106 in the terminal end portion 44 of housing 32. Each of the grooves 146 has a bottom wall comprising a respectively aligned portions of the plate 140 which has extended through it a slot 154. Also, each of the grooves 148 and slots 154 have respectively aligned central portions which are enlarged laterally to provide them with generally rectangular configurations. The grooves 148 are laterally spaced apart in array 146 by interposed ridge-like projections 156 and 158, respectively, which correspond to the ridge-like projections 116 and 118, respectively, in the terminal end portion 44 of housing 32 shown in FIG. 2. The projections 156 and 158 extend integrally from the plate 10 and terminate in substantially flat surfaces which interface with the flat surfaces of projections 116 and 118, respectively, in FIG. 2.

Projections 156 are provided with respective flat surfaces which have greater lengths than the flat surfaces of projections 158 and are substantially egual to the lengths of the flat surfaces terminating projections 116 in FIG. 2. However, in this instance, the projections 156 extend a greater distance from the plate 140 than the projections 158 whereby the flat surfaces of projections 158 are spaced a predetermined distance below the flat surfaces of projections 156. Accordingly, when the contact retainer bar 80 is secured to the terminal end portion 44 of housing 32, the projections 118 extend up into the array 146 of grooves 48 to locate the contact retainer bar 80 accurately with respect to the terminal end portion 44 when securing the contact retainer bar 80 thereto.

The generally rectangular depressions 150 and 152 have adjacent longitudinal sides defined by respective projections 156 which have disposed therebetween a groove 148. The opposing longitudinal sides of depressions 150 and 152 are defined by respective projections 156 which form with adjacent laterally spaced projections 158 respective interposed grooves 148. Also, each of the depressions 150 and 152 have respective closed ends defined by respective projections 159 extending integrally from the plate 140 and terminating in respective flat surfaces which are spaced predetermined distances below the flat surfaces of projections 156. Consequently, when the contact retainer bar 80 is secured to the terminal end portion 44 of housing 32, as shown in FIG. 1B, the flat surfaces of the respective projections 156 and 159 defining the depressions 50 and 152 interface with the respective projections 116 and 124 defining the depressions 110 and 112, respectively. As a result, the depression 150 cooperates with the depression 110 and the depression 152 cooperates with the depression 112 to form respective box-like cavities wherein electrical components (not shown) may be mounted for electrical connection with the terminal end portions 86 of module 10.

Figure 7B:
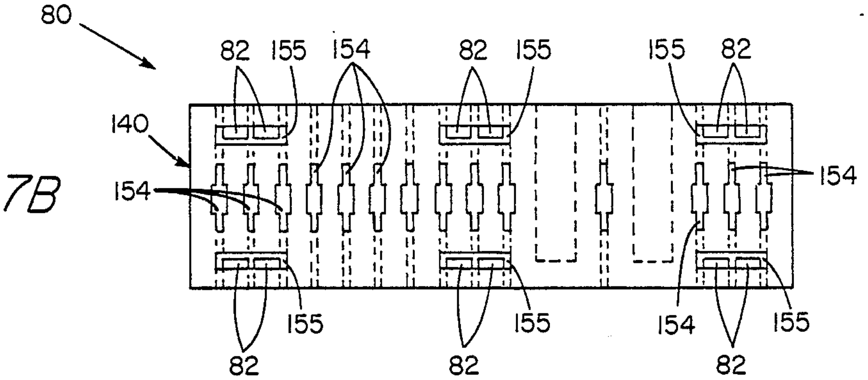
FIG. 7B is a plan view of the outer surface of the contact retaining bar shown in FIG. 7.
Figure 7A:
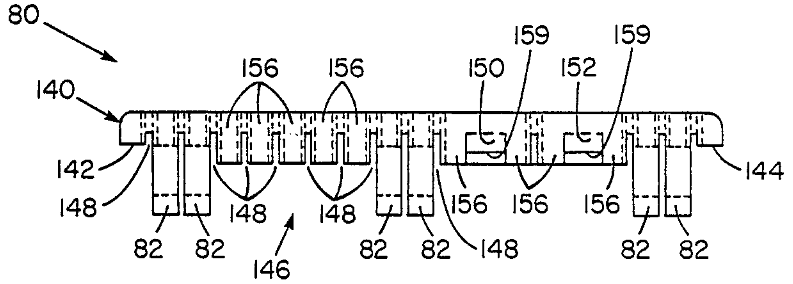
FIG. 7A is an elevational side view of the contact retaining bar shown in FIG. 7.
Figure 7C:
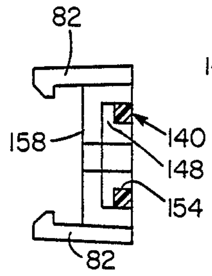
FIG. 7C is a cross-sectional view taken along the line 7C—7C shown in FIG. 7 (3 places) and looking in the direction of the arrows.

Disposed in opposing end portions of the linear array 146 and in the midportion thereof are respective grooves 148 defined by respective pairs of laterally spaced projections 158. Each pair of projections 158 has opposing ends separated from respective pairs of flexible legs 82 by interposed through-slots 155 provided in the plate 140 for molding purposes. The flexible legs 82 in each pair are laterally spaced apart by an extension of the groove 148 disposed between the aligned pair of projections 158. Thus, as shown in FIG. 7C, each of the ridge-like projections 158 extends between opposing flexible legs 82 which depend integrally from opposing longitudinal side portions of the plate 140 and terminate in respective distal end portions. The distal end portions of flexible legs 82 are provided with respective inwardly projecting shoulders for engaging, as shown in FIGS. 1B and 1D, sheer end surfaces of respective ramp-like portions 84. The ramp-like portions 84, as shown in FIGS. 2 and 2D, protrude integrally from opposing ends of the ridge-like projections 118 in terminal mounting end portion 44 of housing 32.

Accordingly, the flexible legs 82 comprise respective latching means for securing the contact retainer bar 80 removably to the terminal mounting end portion 44 of housing 32. When the contact retainer bar 80 is fastened to the terminal mounting end portion 44, as shown in FIGS. 1 and 1B, the projections 156 and 158 have their terminating flat surfaces brought into interfacing relationship with terminating flat surfaces of respective projections 116 and 118 shown in FIG. 2. Also, since the projections 118 of array 106 protrude into the array 146, as previously described, the projections 118 of terminal mounting end portion 44 interfitting with the projections 156 of contact retainer bar 80 provides means for preventing the contact retainer bar 80 from moving laterally relative to the terminal mounting end portion 44 of housing 32. Moreover, the tabs 126 extending integrally from side edge portions of the respective contact members 62, 64, 60 and 74 shown in FIGS. 1. 3–6 are press-fitted into respective aligned slots 154 shown in FIG. 7B.

Figure 7:
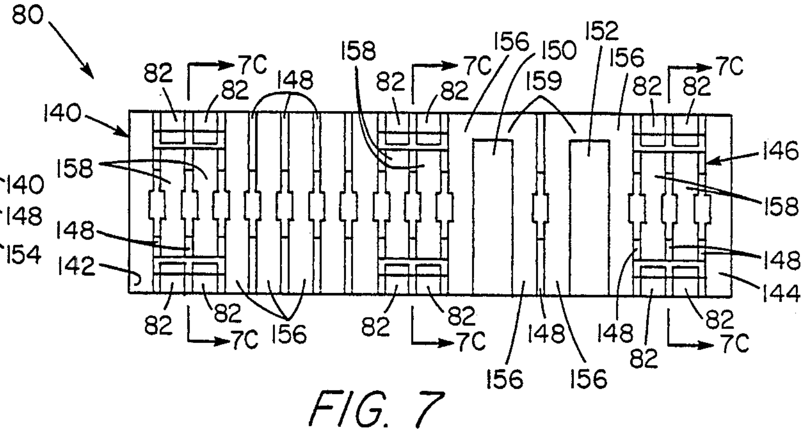
FIG. 7 is a plan view of the inner surface of the contact retaining bar shown in FIG. 1.
Figure 8B:
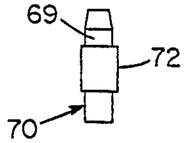
FIG. 8B is an elevational view of one end of the dielectric lifter shown in FIG. 8.
Figure 8:
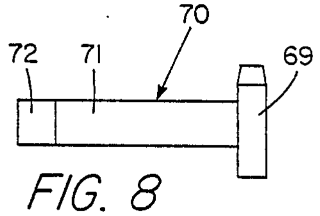
FIG. 8 is an elevational side view of one of the dielectric lifters shown in FIG. 1 (2 places)
Figure 8C:
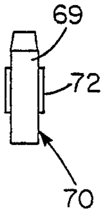
FIG. 8C is an elevational view of the other end of the dielectric lifter shown in FIG. 8.
Figure 8A:
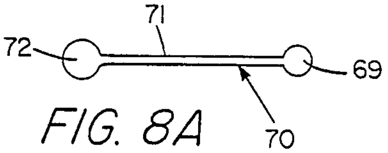
FIG. 8A is a plan view of the lower surface of the dielectric lifter shown in FIG. 8.
Figure 9C:
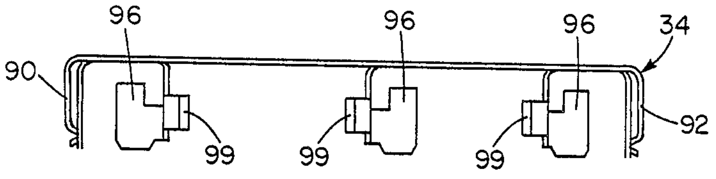
FIG. 9C is an elevational view of the upper end of the ground plane cover shown in FIG. 9.
Figure 9A:
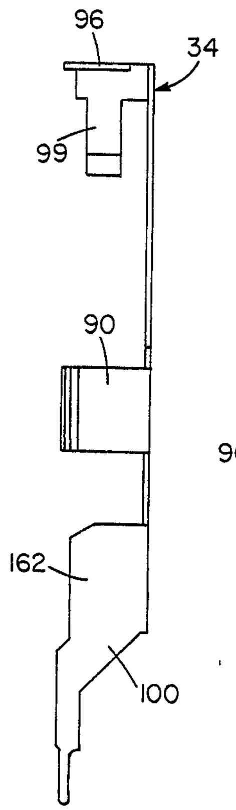
FIG. 9A is an elevational view of one side of the ground plane cover shown in FIG. 9.
Figure 9:
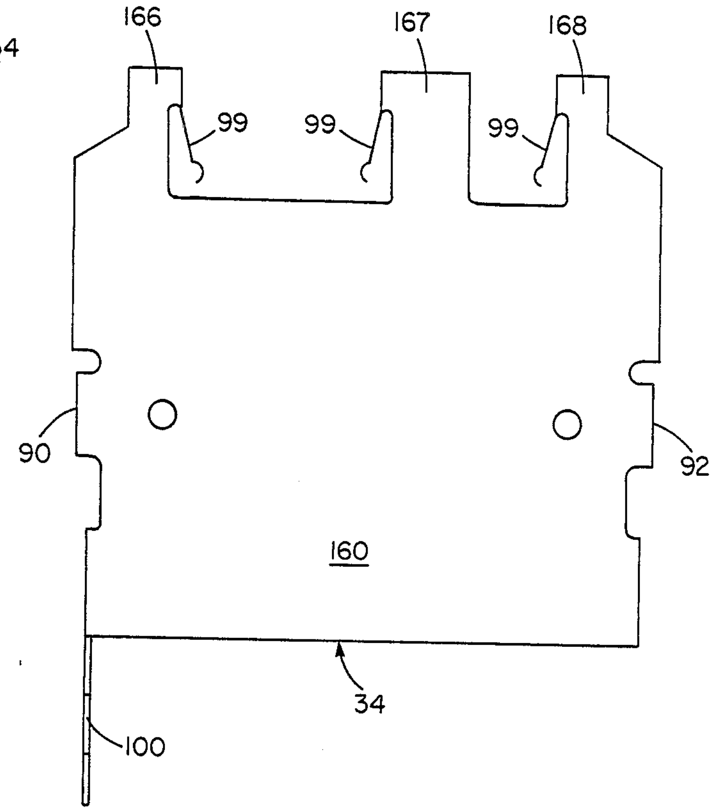
FIG. 9 is a plan view of the outer surface of the ground plane cover shown in FIG. 1.
Figure 9B:
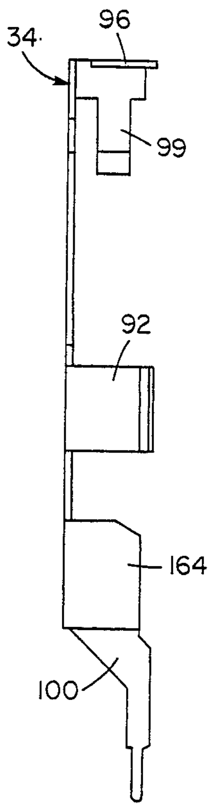
FIG. 9B is an elevational view of the other side of the ground plane cover shown in FIG. 9.

As a result, the contact members 60, 62, 64 and 74 have their respective midportions and terminal end portions 86 held firmly in substantially parallel relationship with one another, as shown in FIG 1. Also, the opposing broad surfaces of the respective contact 60, 62, 64 and 74 extend in the direction of the thickness of module 10 and substantially perpendicular to the side wall 36 of housing 32. The respective end portions 142 and 144 of plate 140 shown in FIG. 7 are disposed in interfacing relationship, as shown in FIG. 1B, with the terminating flat surfaces of respective projections 120 shown in FIG. 2. Consequently, there is disposed between opposing ends of the installed retainer bar 80 adjacent end portions of the narrow side walls 38 and. 40 respective open grooves 108 which receive the depending side portions 162 and 164, respectively of cover 34.

As shown in FIGS. 8 and 8A–8C, each of the dielectric lifters 70 has a small diameter end portion 69 which is substantially cylindrical. The small diameter end portion 69 is provided with a suitable diametric size for slidably engaging the inner cylindrical wall surfaces of the sockets 68 shown in FIG. 2. Thus, the outer cylindrical surface of small diameter end portion 69 and the inner cylindrical surface of a supporting socket 68 preferably are low-friction bearing surfaces for enhancing rotation of the small diameter end portion 69 in the supporting socket 68. The small diameter end portion 69 is integrally joined to one end of intermediate bar-like portion 71 which has an opposing end integrally joined to larger diameter end portion 72.

Bar-like portion 71 has a rectangular cross-section with opposing narrow surfaces which are disposed substantially flush with respective opposing end surface of the large diameter end portion 72. The bar-like portion 71 is provided with a suitable thickness for, as shown in FIG 1, extending through an axial opening in the wall of a supporting socket 68 with sufficient clearance to permit angular movement of the bar-like portion 71 during rotation of the attached small diameter end portion 69. Large diameter end portion 72 of the lifter 70 comprises a cylinder of substantially less height than the height of small diameter end portion 69. Also, the larger diameter end portion 72 has a diametric size suitable for, as shown in FIG 1, simultaneous tangential engagement with a ring actuated contact member 60 and an adjacent movable contact member 74 of an electrical switch. Thus, the larger diameter end portion 72 provides low friction means for moving arcuately and insulatingly actuating the movable contact member 74 in response to actuation of the contact member 60.

As shown in FIGS. 9 and 9A–9C, the cover 34 comprises a thin sheet of resilient electrically conductive material having a configuration which conforms generally to the open side of housing 32 (FIG. 2) including the terminal mounting end portion 44 thereof. Accordingly, the cover 34 is provided with an end portion 60 which is designed to overlie the contact retainer bar 80 secured to terminal end portion 44 when the cover 34 is installed over the open side of housing 32 as shown in FIG 1. The end portion 160 terminates in an end of cover 34 which is disposed approximately flush with the adjacent end of housing 32 when the cover 34 is installed on the housing 32. Also, the end portion 160 includes opposing side edges of cover 34 from which depend integrally respective side wall portions 162 and 164 of cover 34. As shown in FIG. 1B, the side wall portions 162 and 164 are inserted into respective grooves in portions of the terminal mounting end portion 44 adjacent respective end portions of the side walls 38 and 40. The grooves which receive the side wall portions 162 and 164 are disposed, as shown in FIG. 2, between respective projections 120 and adjacent end portions of the respective side walls 38 and 40.

The side wall portion 162 has an end portion terminating in alignment with the adjacent end of cover 34 and has extending integrally therefrom the electrical grounding terminal 100. Grounding terminal 100 has a configuration similar to the configurations of terminal end portions 86 of the respective contact members 62, 64, 60 and 74 shown in FIGS. 3–6. As shown in FIGS. 1 and 1C, when the cover 34 is installed over the open side of housing 32, the grounding terminal 100 protrudes from the terminal mounting end portion 44 in substantially parallel spaced relationship with the terminal end portions 86 and constitutes an end member of the array 88. The end portion 160 of cover 34 is integrally joined to a midportion thereof having opposing side edges from which depend integrally respective resilient latching tangs 90 and 92. Each of the tangs 90 and 92 terminate in a rippled end portion which, as shown in FIGS. 1E and 1F, latchingly engage sheer end surfaces of respective ramp-like portions 94 when the cover 34 is installed over the open side of housing 32. The ramp-like portions 94, as shown in FIGS. 2, 2E and 2F, protrude from recessed areas of narrow side walls 38 and 40, respectively, which receive therein the respective latching tangs 90 and 92 depending from opposing side edges of cover 34.

The midportion of cover 34 is integrally joined to an opposing end portion of the cover having protruding coplanarly therefrom three neck-end portions 166, 167 and 168, respectively, which are laterally spaced apart by interposed U-shaped openings in the cover. Each of the neck-end portions 166, 167 and 168 has adjacent the entrance of one of the U-shaped openings a terminal corner having a side edge from which a right-angle bent portion of the cover depends and supports an integral sleeve contact 99 in the adjacent U-shaped opening. Also, the right-angle bent portion has a right-angle extension which is aligned with the other edge of the terminal corner and supports adjacent thereto a resilient latching tang 96. Consequently, when the cover 34 is installed over the open side of housing 32, as shown in FIG. 1, the neck-end portions 166, 167 and 168 overlie the respective mesa-like portions 66 having therein the sockets 68 shown in FIG. 2. Thus, the neck-end portions 166, 167 and 168 of cover 34 retain the small diameter end portions 69 of installed lifters 70 in the supporting sockets 68. Also, the terminal corners of neck-end portions 166, 167 and 168 are pressed down over aligned corners of the respective mesa-like portions 66 until the resilient latching tangs 96 engage sheer end surfaces of respective ramp-like portions 98 as shown in FIG. 1G. The ramp-like portions 98 protrude integrally from adjacent surfaces of the respective mesa-like portions 66 as shown in FIG. 2 and 2G.

As shown in FIGS. 2, 2A and 2G, portions of the side wall 36 between the mesa-like portions 66 and the inner surface of mounting bracket 42 are provided with respective slotted through-holes 102. The through-holes 102 are disposed in alignment with the sheer end surfaces of ramp-like portions 98 protruding integrally from adjacent surfaces of the mesa-like portions 66. Consequently, the through-holes 102 provide access means for disengaging the resilient latching tangs 98 from the sheer end surfaces of the respective ramp-like portions 98. The resilient latching tangs 90 and 92 of cover 34, as shown in FIGS. 1, 1E and 1F, are readily accessible for disengagement from the sheer end surfaces of ramp-like portions 94 protruding integrally from recessed areas of the respective narrow side walls 38 and 40. Therefore, the cover 34 is removably secured to the housing 32 in five places, namely, the resilient latching tangs 96 engaging sheer end surfaces of the ramp-like portions 98 adjacent the respective collars 48–50 and the resilient latching tangs 90 and 92 engaging sheer end surfaces of ramp-like portions 94 on opposing narrow side walls 38 and 40, respectively, of housing 32.

Moreover, when the cover 34 is installed over the open side of housing 32, as shown in FIG 1, the inner end portions of collars 48–50 are exposed to view through the U-shaped openings in cover 34. Also, the sleeve contacts 99 extending into the U-shaped openings from the adjacent sides of respective neck-end portions 166–168 terminate in rippled end portions which are disposed in alignment with the apertures 52–54 defined by collars 48–50, respecively, which are shown in FIG. 1A. Furthermore, each of the sleeve contacts 99 is electrically connected through the cover 34 to the grounding terminal 100 extending integrally from the side wall portion 162 of cover 34.

Figure 12:
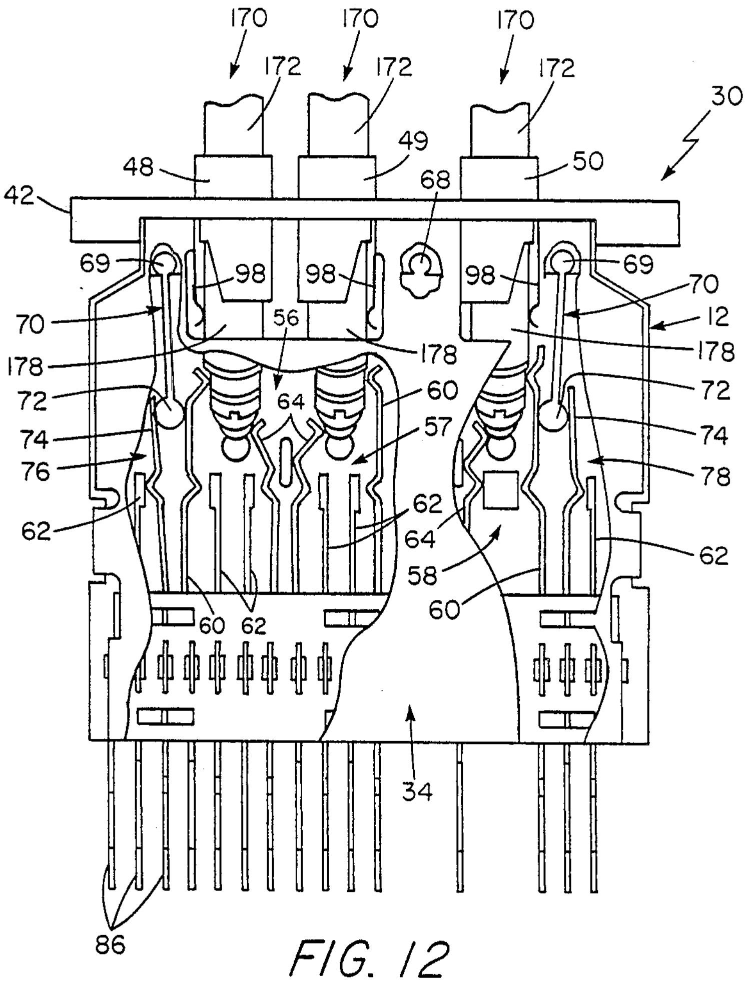
FIG. 12 is a plan view, partly fragmentary, of the module shown in FIG. 1 but as actuated by the electrical jack plug shown in FIG. 10.
Figure 10:
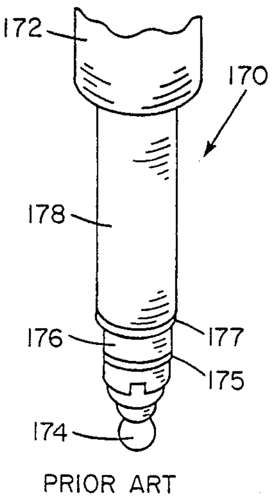
PRIOR ART FIG. 10
FIG. 10 is a fragmentary plan view of a conventional electrical jack plug suitable for use with the electrical jack module shown in FIG. 1.

In FIG. 10, there is shown a conventional jack plug 170 suitable for use with the assembled slab-like module 30 shown in FIG. 12. The jack plug 170 has a cylindrical body extending axially from a dielectric sheath 172 and terminating at its distal end in an electrically conductive tip 174. The tip 174 is insulated by an interposed dielectric grommet 175 from an electrically conductive ring 176 which is insulated by an interposed dielectric grommet 177 from an electrically conductive sleeve 178 extending from the dielectric sheath 172. It is well known that the tip 174, ring 176 and sleeve 178 of jack plug 170 may have respective electrically conductive portions extended insulatingly through the body of jack plug 170 to respective terminals (not shown) in the dielectric sheath 172. Generally, the sheath 172 may be withdrawn axially to expose the terminals therein for electrical connection to respective wire conductors (not shown). Thus, the tip 174, ring 176 and sleeve 178 of jack plug 170 may be connected to respective portions of external electrical circuitry (not shown).

Figure 11:
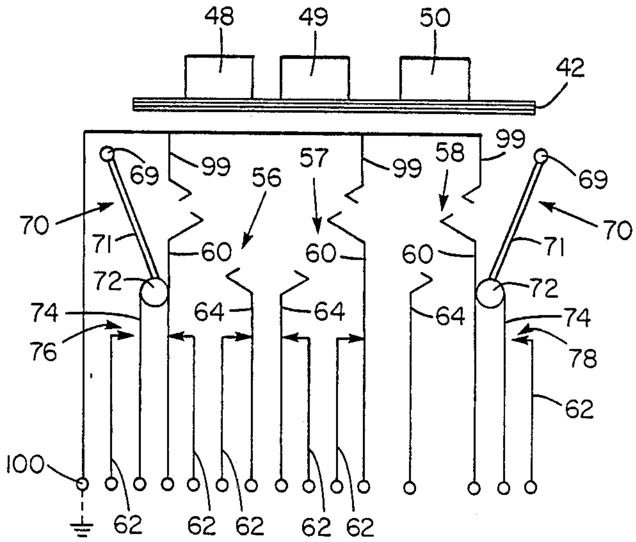
FIG. 11 is an electrical schematic view of the unactuated electrical contacts shown in FIG. 1.

As shown in FIG. 11, prior to insertion of the electrical jack plug 170 in the module 30 shown in FIG. 12, the electrical jacks 56, 57 and 58 have respective sleeve contacts 99 disposed for connection to electrical ground. Also, the electrical jacks 56 and 57 have their ring actuated contact members 60 and their tip actuated contact members 64 disposed in electrical engagement with respective stationary contact members 62. Moreover, the respective movable contact members 74 of electrical switches 76 and 78 are not disposed in electrical engagement with the respective stationary contact members thereof.

As shown in FIG. 12, when the electrical jack plug 170 is inserted through the collar 48 of electrical jack 56 and into housing 32, the tip actuated contact member 64, ring actuated contact member 60 and the sleeve contact member 98 of electrical jack 56 have their rippled end portions pressingly engaged by the tip 174, ring 176 and sleeve 178, respectively, of jack plug 170. As a result, the tip actuated contact member 64 of electrical jack 56 is moved resiliently out of electrical engagement with the engaged stationary contact member 62 and is electrically connected to the tip 174 of jack plug 170. Also, the ring actuated contact member 60 of electrical jack 56 is moved resiliently out of electrical engagement with the engaged stationary contact member 62 and is electrically connected to the ring 176 of jack plug 170. Moreover, the resilient lateral movement of ring actuated contact member 60 causes the large diameter end portion 72 of dielectric lifter 70 to press laterally against the movable contact member 74 of switch 76. Consequently, the movable contact member 74 is moved resiliently into electrical engagement with the stationary contact member 62 of switch 76. Thus, the dielectric lifter 70 is independently supported for pivotal movement to actuate insulatingly the movable contact member 74 in response to actuation of the contact member 60 in electrical jack 56. Furthermore, the sleeve contact 98 of electrical jack 56 is electrically connected to the sleeve 178 of jack plug 170 for connection thereof to electrical ground plane cover 34 of module 10.

It may be readily seen that when the electrical jack plug 170 is withdrawn from the collar 48 of electrical jack 56, the tip actuated and ring actuated contact members 64 and 60, respectively, of electrical jack 56 move resiliently back into electrical engagement with the respective formerly engaged contact members 62. As a result, the movable contact member 74 of switch 76 presses laterally against the large diameter end portion 72 thereby causing the lifter 70 to pivot and enable the large diameter end portion 72 to follow the ring actuated contact member 60 of electrical jack 56. Consequently, the movable contact member 74 is permitted to move resiliently out of electrical engagement with the stationary contact member 62 of switch 76. Moreover, the sleeve contact 99 of electrical jack 56 springs resiliently back to a relaxed position where its rippled end portion is disposed in alignment with the collar 48.

Also, it may be readily seen that when the electrical jack plug 170 is inserted through the collar 49 of electrical jack 57 and into the housing 32, the tip actuated contact member 64, ring actuated contact member 60 and sleeve contact member 99 of electrical jack 57 function in a manner similar to that described in connection with electrical jack 56. However, since a dielectric lifter 70 is not installed in the aligned socket 68 for operation with the electrical jack 57, the resulting resilient movement of ring actuated contact member 60 relative to its engaged stationary contact member 62 does not produce a corresponding movement of a large diameter end portion 72 to cause resilient movement of movable contact member, such as contact member 74 in switch 76, for example.

Furthermore, it may be readily seen that when the electrical jack plug 170 is inserted through the collar 50 of electrical jack 58 and into housing 32, the tip actuated contact member 64, ring actuated contact member 60 and sleeve contact member 99 of electrical jack 58 function in a manner similar to that described in connection with electrical jack 56. However, since there are no stationary contact members 62 installed in electrical jack 58, the resulting resilient movement of its tip actuated and ring actuated contact members 64 and 60, respectively, does not cause breaking and re-making of electrical contact with respective stationary contact members 64, as in the operation of respective electrical jacks 56 and 57. On the other hand, the resulting resilient movement of the ring actuated contact member 60 of electrical jack 58 causes corresponding movement of a large diameter end portion 72. As a result, the dielectric lifter 70 pivots to permit corresponding resilient movement of a movable contact member 74 relative to a stationary contact member 62 of the electrical switch 78.

Figure 12A:
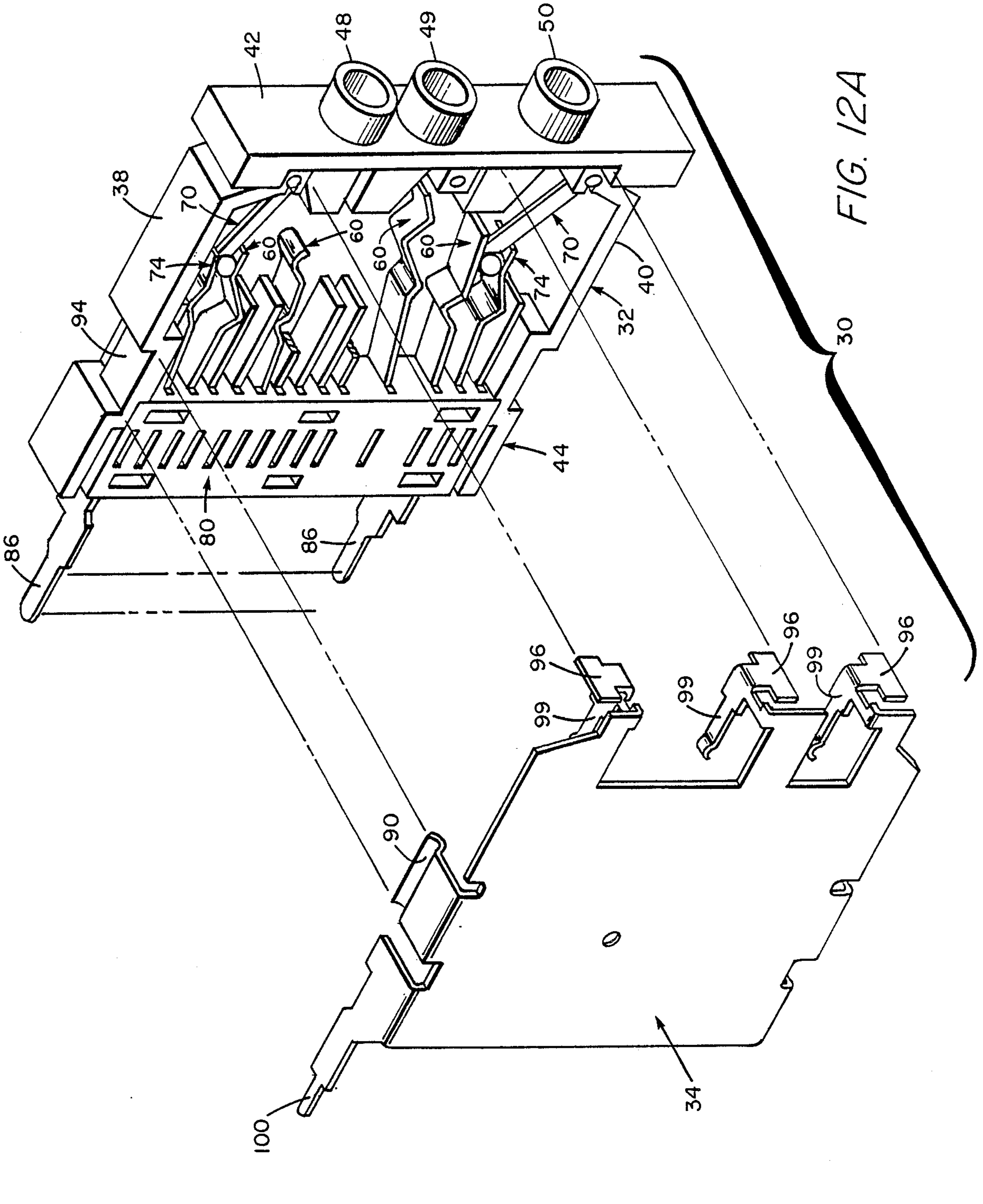
FIG. 12A is an exploded isometric view of the assembled module shown in FIG. 12 with the jack plugs removed.

Thus, in FIG. 12A, it may be seen that the module 30 has a slab-like body with a broad planar surface thereof comprising the ground plane cover 34 which is provided with an electrical ground terminal 100 for directing stray electrical signals to electrical ground. Also, the module 30 is provided with dielectric lifter means 70 rotatably supported independently of electrical jack contact members for pivoting and insulatingly actuating a movable contact member 74 of an electrical switch in response to actuation of an electrical jack contact member 60. Moreover, the module 30 is provided with a linear array of staggered terminal end portions 86 which are laterally spaced by precisely disposed grooves in the terminal mounting end portion 44 of housing 32 and the contact retainer bar 80 removably secured thereto. Furthermore, the terminal end portions are integrally joined through respective blade-like midportions, which extend in the thickness of the slab-like body of the module, to respective contact end portions which move resiliently between opposing narrow side walls of the slab-like body.

In FIGS. 13 and 13A–13C, there is shown a printed circuit board subassembly 180 which is suitable for use with the slab-like module 10 shown in FIGS. 1 and 1A–1C of the drawings. The subassembly 180 includes a multi-layer printed circuit board 182 having opposing broad surfaces 184 and 186, respectively. The surface 186 has an end portion below which there is insulatingly disposed in the board 182 a linear array of laterally spaced, printed circuit conductors 188 which are substantially parallel with one another. Each of the conductors 188 interconnects an aligned pair of spaced eyelets or plated through-holes 190 which extend from the surface 186 to the surface 184 of board 182. On the surface 184 of board 182, each pair of plated through-holes 190 is connected, as by soldering, for example, to an end portion of a respective rigid terminal lug 192 made of electrically conductive material, such as tin plated brass, for example. As shown in FIG. 13E, each of the terminal lugs 192 may comprise a rod-like end portion integrally joined to an opposing broader end portion having protruding integrally therefrom a pair of mutually spaced fingers 193. The fingers 193 are inserted and fixedly secured in a pair of aligned through-holes 190 such that the rod-like end portion of the terminal lug 192 protrudes from the adjacent end of board 182. Thus, the board 182 has extending from one end thereof a linear array of laterally spaced terminal lugs 192 to which respective wire conductors (not shown) may be connected, as by wire-wrapping, for example.

The midportion of board 182 may be provided with a plurality of spaced eyelets or plated through-holes 194 which extend from the surface 184 to the surface 186 of board 182. Also, there may be disposed on the surface 184 of board 182, respective components 196, 197 and 198 and conductive ground pads 199 and 200, respectively. The components 196, 197 and 198 generally are provided with respective conductive leads or terminal wires which may be electrically connected, as by soldering, for example, into respective plated through-holes 194 in the midportion of board 182. A plurality of printed circuit conductors 201 are insulatingly disposed in mutually spaced relationship with one another in the board 182 and adjacent the surfaces 184. Also, a plurality of printed circuit conductors 202 are insulatingly disposed in mutually spaced relationship with one another in the board 182 and adjacent the surface 186. Some of the conductors 201 and 202 electrically connect the terminal lugs 192 to respective plated through-holes 194 in the midportion of board 182.

The majority of the conductors 201 and 202 electrically connect the terminal lugs 192 and the plated through-holes 194 to respective eyelets or plated through-holes 204 which are mutually spaced apart in two parallel rows adjacent an inset portion of the opposing end of board 182. Disposed in the inset portion is a connector 206 having adjacent the board 182 a rear portion 208 from which extends a plurality of laterally spaced contact strips 210. The contact strips 210 have end portions electrically connected, as by soldering, for example, into respective aligned through-holes 204 in the board 182 and extend into a front portion 212 of connector 206. Within the front portion 212, each of the contact strips 210 terminates in alignment with a respective terminal receiving opening 214 in a forward surface 213 of front portion 212 which is disposed in recessed relationship with an adjacent extreme end 211 of board 182.

As shown in FIG. 13C, the rear portion 208 of connector 206 may comprise a cap portion 215, which interfaces with the adjacent surface of front portion 212, and a rearwardly extending mandrel portion 217. The mandrel portion 217 and the cap portion 215 may have respective orthogonal surfaces forming a right-angle recess wherein the inset end portion of board 182 may be supported while the contact strips 210 are being soldered in respective through-holes 204 in the inset end portion of board 182. Thus, when soldering is completed, the printed circuit board 182 is firmly supported by the connector 206.

As shown in FIGS. 13 and 13D, the opposing surface of mandrel portion 217 may be sloped and have projecting upwardly therefrom a linear array of laterally spaced divider ridges 218. The ridges 218 are substantially parallel with one another and form therebetween respective U-shaped troughs 216 having bottom surfaces sloping toward the adjacent surface of board 182 and terminating in respective rounded end surfaces. Thus, the contact strips 210 extending from the front portion 212 of connector 206 may be pressed into respectively aligned troughs 216 and bent smoothly around the end surface thereof. Also, each of the plated through-holes 204 in the inset end portion of board 182 may be disposed adjacent the rounded end surface of a respective trough 216 such that the bent end portion of the aligned contact strip 210 may be fed directly into the through-hole 204 and soldered therein.

Figures 14, 14A, 15, 15A:
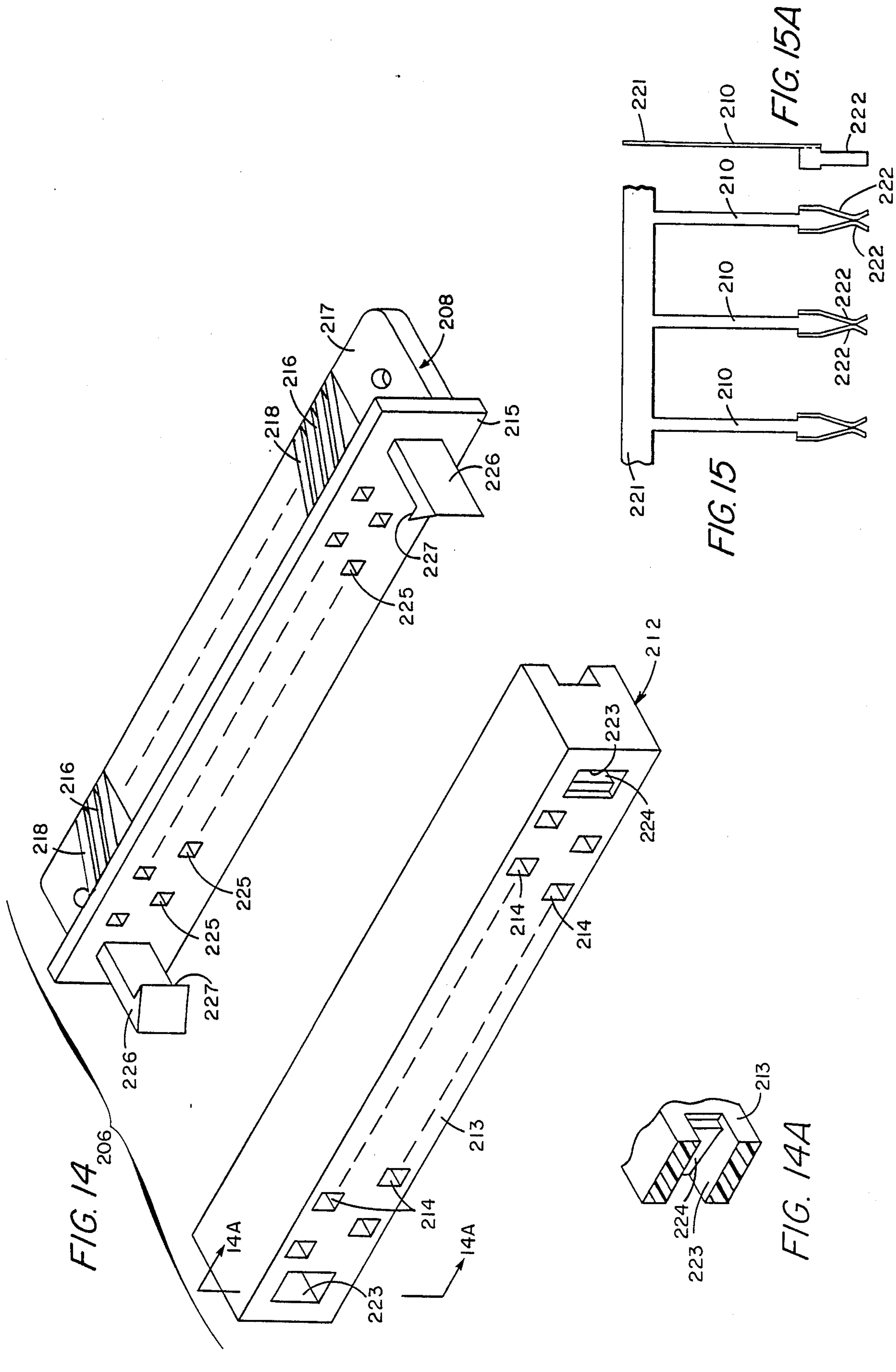
FIG. 14 is an exploded isometric view of the connector shown in FIG. 13.
FIG. 14A is a fragmentary sectional view taken along the line 14A—14A shown in FIG. 14 and looking in the direction of the arrows.
FIG. 15 is a plan view of a daisy chain device for ease in fabrication of the receptacle terminals for the connector shown in FIG. 13.
FIG. 15A is an elevational end view of the daisy chain device shown in FIG. 15.

In FIG. 14, there is shown the connector 206 including front portion 212 having the forward surface 213 wherein the terminal receiving openings 214 are mutually spaced apart and disposed in two substantially parallel rows. By comparing FIG. 14 with FIGS. 1 and 1C, it may be seen that the openings 214 are suitably disposed in the forward surface 213 of connector 206 for receiving the linear array 88 of staggered terminal end portions 86 and grounding terminal 100. The terminal receiving openings 214 in surface 213 extend through the front portion 212 to the opposing surface thereof. As shown in FIGS. 15 and 15A, the contact strips 210 initially may extend integrally from a common support member 221 of a daisy chain made of suitable electrically conductive material, such as nickel alloy material, for example. The common support member 221 may be discarded when all the contact strips 210 are cut therefrom for insertion into respective openings 214 in the surface of portion 212 adjacent the rear portion 208.

Each of the contact strips 210 terminates at its distal end portion in a respective pair of resilient contacts 222 having rippled end portions biased into electrical engagement with one another. Thus, a contact strip 210 cut from the common support member 221 has its resilient contacts 222 inserted into a respective opening 214 in the rear surface of portion 212 and urged forward until the inserted contacts 222 are disposed adjacent the aligned opening 214 in forward surface 213. Consequently, when all of the openings 214 in forward surface 213 have disposed therein a respective pair of resilient contacts 222, there is a corresponding number of contact strips 210 extending from the rear of front portion 212. Disposed in opposing end portions of the front portion 212 are respective rectangular through-apertures 223. Each of the apertures 223 has adjacent the openings 214 a side surface from which protrudes integrally a ramp-like portion 224 having a sheer end surface adjacent the forward surface 213, as shown in FIG. 14A.

The rear portion 208 of connector 206 includes cap portion 215, which interfaces with the front portion 212, and an orthogonally extending portion 217. Portion 217 has a rectilinear surface forming with an adjacent surface of cap portion 215 the right-angle recess wherein the inset end portion of board 182 shown in FIG. 13 is disposed. Also, portion 217 has the opposing sloped surface from which a linear array of laterally spaced ridges 218 extend for forming interposed troughs 216. The cap portion 215 has extended through its thickness two rows of mutually spaced holes 225. Each of the holes 225 is aligned with a respective one of the openings 214 in the forward surface 213 of front portion 212 and is aligned with a respective one of the troughs 216.

Also, the cap portion 215 has extending integrally from opposing end portions of its surface adjacent portion 212 respective flexible latching legs 226. Each of the latching legs 226 has a distal end portion provided with an inwardly extending shoulder 227 which is disposed for interference engagement with a respective one of the ramp-like portions 224 in an aligned aperture 223. Accordingly, when the contact strips 210 extending from the rear surface of front portion 212 are fed through respective holes 225, the cap portion 215 is urged toward interfacing relationship with the front portion 212. As a result, the distal end portions of flexible legs 226 enter the respectively aligned apertures 223 and slide along the sloped surfaces of respective ramp-like portions 224 therein.

Consequently, the cap portion 215 is brought into interfacing relationship with the front portion 212 and the shoulders 227 of flexible legs 226 slide off sheer ends of ramp-like portions 224 to engage latchingly the sheer end surfaces thereof. The contact strips 210 then may be pressed into respectively aligned troughs 216 and bent around the rounded ends thereof, as described. If it should be necessary to disassemble the self-latching connector 206, the contact strips may be straightened and the shoulders 227 of legs 226 may be disengaged by way of the end openings of apertures 223 in forward surface 213. Thus, the cap portion may be removed from interfacing relationship with the front portion 212 to examine the resilient contacts 222 of any of the installed contact strips 210.

Figure 16B:
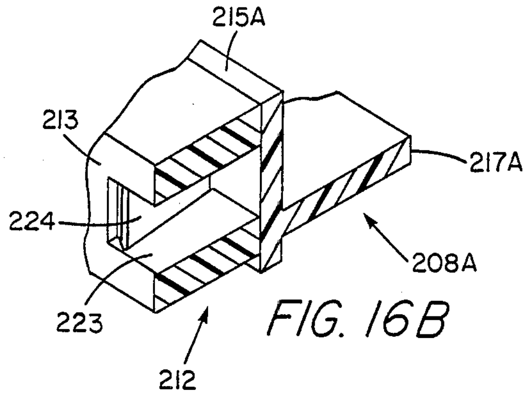
FIG. 16B is a sectional view taken along the line 16B—16B shown in FIG. 6 and looking in the direction of the arrows.
Figure 16A:
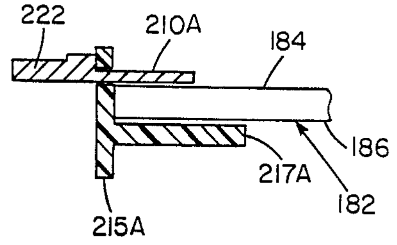
FIG. 16A is a sectional view taken along the line 16A—16A shown in FIG. 6 and looking in the direction of the arrows.
Figure 16:
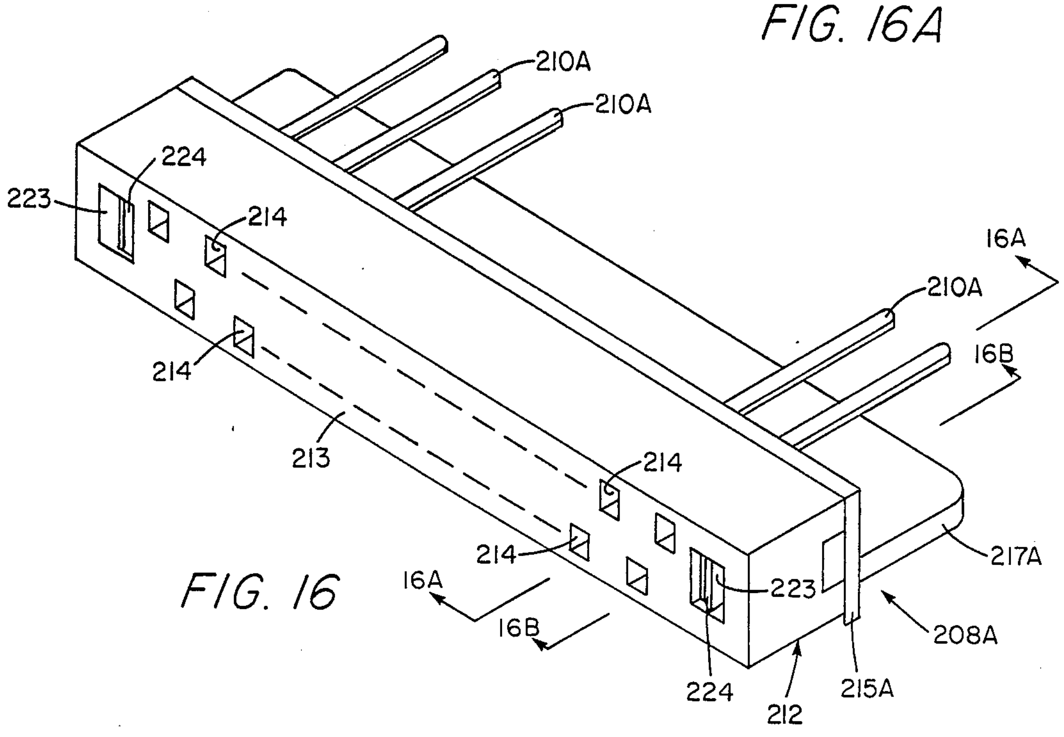
FIG. 16 is an isometric view of the connector shown in FIG. 13 but having an alternative rear portion.

As shown in FIGS. 16 and 16B, the connector 206 may be provided with a front portion 212, which is similar to the front portion shown in FIGS. 14–14A, and with an alternative rear portion 208A. The rear portion 208A has a cap portion 215A which is similar to the cap portion 215 shown in FIG. 14. Thus, the cap portion 215 interfaces with the front portion 212 and has opposing end portions from which extend respective latching flexible legs 226 for removably securing the rear portion 208A to the front portion 212 in a manner similar to the manner in which the latching legs 226 shown in FIG. 14 removably secure the rear portion 208 to the front portion 212. However, the rear portion 208A has a wall portion 217A extending orthogonally with respect to the cap portion 215A but having opposing rectilinear surfaces. Consequently, each of the rectilinear surfaces of portion 217A forms with the adjacent surface of cap portion 215A right-angle support structures wherein the inset end portion of printed circuit board 182 (FIG. 13) may be disposed. Furthermore, the contact strips 210A extending from the front portion 212 and through the cap portion 215A remain rectilinear for electrical connection to respective electrically conductive portions of the board 182 as shown in FIG. 16A.

Figure 17:
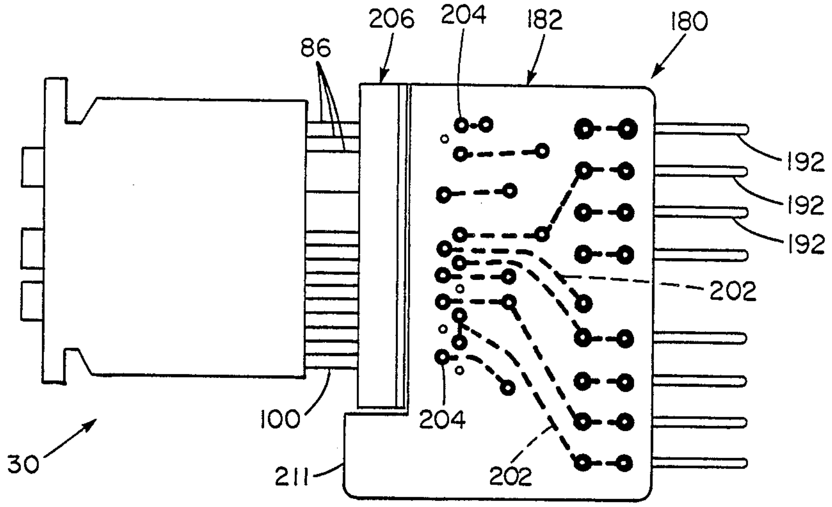
FIG. 17 is a plan view of the sub-assembly shown in FIG. 13 with the module shown in FIG. 1.

As shown in FIG. 17, the subassembly 180 shown in FIGS. 13 and 13A–13D having the connector 206 supporting the printed circuit board 182, as described, may have the module 30 shown in FIGS. 1 and 1A–1G plugged into the connector 206. As a result, the contact members of electrical jacks 56, 57 and 58 are connected electrically through their respective terminal end portions 86 and the grounding terminal 100 to contact strips 210 of the connector 206. As described, the contact strips 210 are connected through respective plated through-holes 204 and connecting printed circuit conductors 201–202 to the rigid terminal lugs 192 extending from the opposing end of the board 182. Consequently, the module 30 plugged into the connector 206 of subassembly 180 functions as a feedthrough channel for electrical signals.

Figure 18:
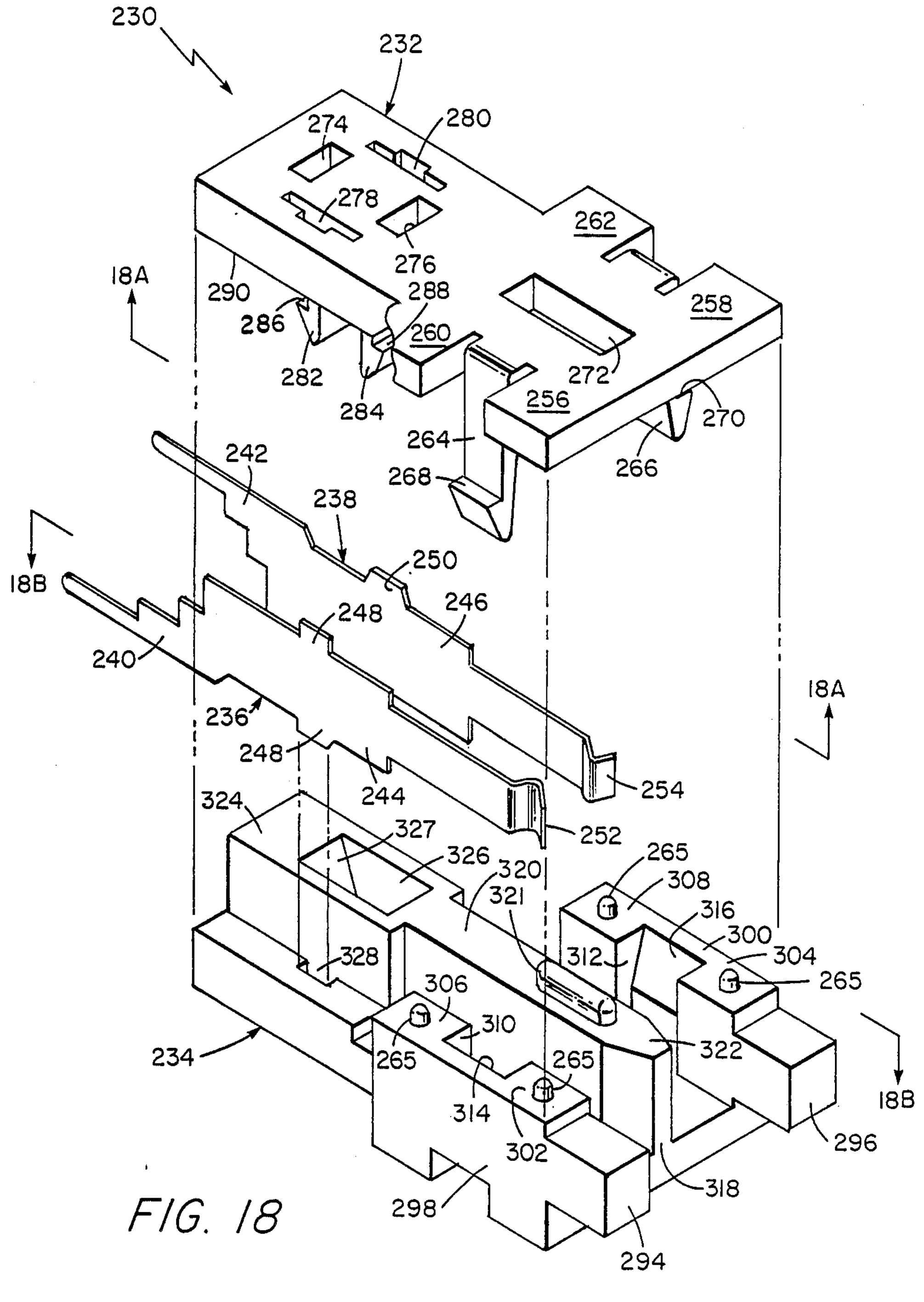
FIG. 18 is an exploded isometric view of a lamp jack embodying the novel lamp jack features of this disclosure.

In FIG. 18, there is shown a self-latching lamp jack 230 comprising two dielectric plates, 232 and 234, respectively, which are secured removably to one another for insulatingly holding two interposed contact members, 236 and 238, respectively, in operative aligned relationship with one another. The plates 232 and 234 are made of dielectric material, such as molded plastic material, for example, and the contact members 236 and 238 are made of electrically conductive material, such as nickel alloy material, for example. The contact members 236 and 238 have respective terminal end portions 240 and 242 integrally joined to respective midportions 244 and 246. Each of the midportions 244 and 246 has projecting from opposing side edges thereof respective blade-like tabs 248–250. Thus, it may be seen that the terminal end portions 240 and 242 of contact members 236 and 238, respectively, are similar to the terminal end portions 86 of the respective contact members 62, 64, 60 and 74 shown in FIGS. 3–6A for the module 30.

Also, the contact members 236 and 238 have respective rippled end portions 252 and 254 disposed in laterally aligned, spaced relationship with one another. Accordingly, it may be seen that the contact members 236 and 238 have similar configurations but are reverted with respect to one another to stagger their terminal, end portions 240 and 242 with respect to one another. Furthermore, the contact members 236 and 238 are reverted to position the crests of their rippled end portions 252 and 254 in opposing relationship with one another. Moreover, the contact members 236 and 238 are disposed to have their respective opposing tabs 248 and 250 directed toward the plates 232 and 234, respectively.

Figure 18A:
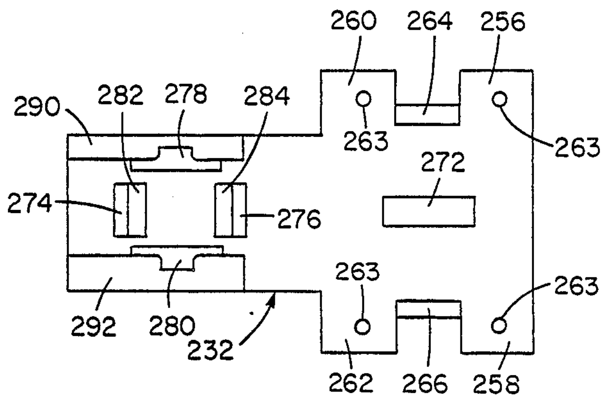
FIG. 18A is a plan view of the inner surface of one longitudinal half of the lamp jack shown in FIG. 18.

As shown in FIGS. 18 and 18A, the plate 232 has adjacent one end thereof a pair of arms 256 and 258, respectively, which extend outwardly from opposing side edges of the plate 232. Spaced from the arms 256 and 258 along the side edges of plate 232, there is another pair of arms 260 and 262 which extend outwardly from the opposing side edge of plate 232 in substantially coplanar relationship with the arms 256 and 258, respectively. Each of the arms 256, 258, 260 and 262 has disposed in a respective surface thereof adjacent the plate 234 bottomed locating holes 263. The plate 232 has depending from portions of its opposing side edges between the arms 256–260 and 258–262, respectively, latching flexible legs 264 and 266, respectively, which are laterally aligned with one another. Each of the flexible legs 264 and 266 has a distal end portion provided with a tapered thickness and an outwardly extended latching shoulder 268 and 270. Disposed centrally in a portion of plate 232 between the depending legs 264 and 266 is a keying slot 272 which extends through the thickness of plate 232.

The opposing end portion of plate 232 has disposed therein a longitudinally spaced pair of through-holes 274 and 276, respectively, and has disposed orthogonally thereto a laterally spaced pair of slots 278 and 280, respectively. The slots 278 and 280 extend through the thickness of plate 232 and are aligned with respective blade-like tabs 248 and 250 extending from midportions 244 and 246 of the contacts 236 and 238, respectively. Depending from portions of the plate 232 adjacent the through-holes 274 and 276 is a pair of latching flexible legs 282 and 284, respectively, which are substantially equal in length to the depending legs 264 and 266, respectively. Each of the flexible legs 282 and 284 has a distal end portion provided with a tapering thickness and an outwardly extended latching shoulder 286 and 288, respectively. The flexible legs 282 and 284 are disposed centrally between a pair of laterally aligned ledges 290 and 292 which depend integrally from opposing side edges of the plate 232.

Figure 18B:
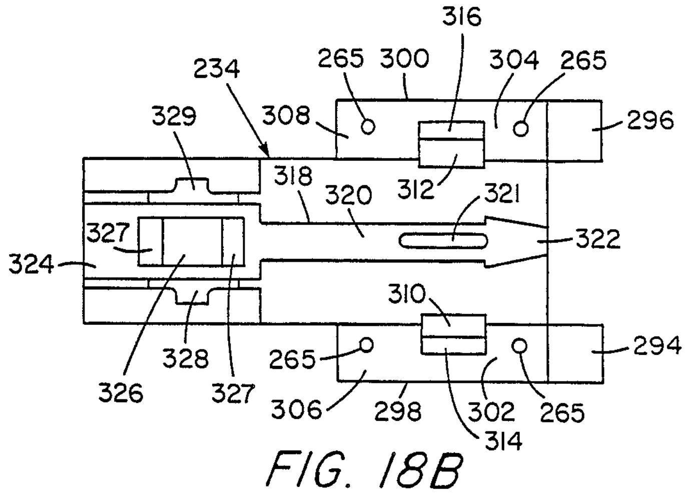
FIG. 18B is a plan view of the inner surface of the other longitudinal half of the lamp jack shown in FIG. 18.

As shown in FIGS. 18 and 18B, the plate 234 has at one end thereof a laterally aligned pair of spaced posts 294 and 296, respectively, which may be provided with respective square cross-sections. Each of the posts 294 and 296 extends integrally from an adjacent end of a longitudinally aligned ledge, 298 and 300, respectively, which project integrally from respective laterally extended side portions of the plate 234. The ledges 298 and 300 terminate in coplanar distal end surfaces having laterally aligned end portions, 302 and 304, respectively, and opposing laterally aligned end portions, 306 and 308, respectively. Each of the surface portions 302, 304, 306 and 308 has protruding integrally therefrom a respective locating pin 265 which is aligned with a respective locating hole 263 in the plate 232. Disposed between the surface end portions 302 and 306 is an open end of a slot 310 which extends through the ledge 298 and the underlying portion of plate 234 to terminate in the opposing surface thereof. Also, disposed between the surface end portions 304 and 308 is an open end of a slot 312 which extends through the ledge 300 and the underlying portion of plate 234 to terminate in the opposing surface thereof. The slots 310 and 312 are laterally aligned with one another and have disposed on outer wall surfaces thereof respective ramp-like portions 314 and 316, respectively.

Projecting integrally from a longitudinally central portion of plate 234 is a plateau-like wall 318 which terminates in a substantially flat surface 320. The wall 318 extends in laterally spaced relationship between the ledges, 298 and 300, respectively, and has a tapering end portion 322 adjacent the respective posts 294 and 296. Wall 318 has an opposing end portion 324 which is laterally enlarged slightly in comparison to end portion 322. In the end portion 324, the surface 320 has disposed therein a slotted aperture 326 which extends through the wall 318 and the underlying portion of plate 234 to terminate in an aligned slotted opening in the outer surface thereof. Opposing end walls of the slotted aperture 326 have respective ramp-like portions 327 protruding therefrom. The slotted aperture 326 is centrally disposed between respective laterally aligned slots 328 and 329 which are disposed in portions of the plate 234 adjacent opposing side surfaces of the wall 318. The slots 328 and 329 extend through the plate 234 and are aligned with respective blade-like tabs 248 and 250 of contact members 236 and 238.

Thus, in assembly, the contact members 236 and 238 are installed on the plate 234 by having their respective downwardly projecting tabs 248 and 250 press-fitted into the slots 328 and 329, respectively, adjacent opposing side surfaces of the wall 318. Then, the plate 232 is aligned with and urged toward the plate 234 to have the distal end portions of flexible legs 264 and 266 enter the aligned slots 310 and 312, respectively, and the distal end portions of flexible legs 282 and 284 to enter respective opposing end portions of the slot 326. The plate 232 is pressed toward the plate 232 to cause the distal end portions of flexible legs 264 and 266 to slide along the sloped surface of ramp-like portions 314 and 316 in the slots 310 and 312, respectively. Simultaneously, the distal end portions of flexible legs 282 and 284 slide along the sloped surfaces of respective ramp-like portions 327 in the opposing end portions of slot 326. Also, the locating rib 321 on wall 318 enters the locating slot 272 in plate 232 and the locating pins 265 on respective surface portions 302, 304, 306 and 308, of ledges 298 and 300 enter the locating holes 263 in surfaces of the arms 256, 258, 260, and 262 respectively. Furthermore, the upwardly projecting tabs 248 and 250 of contact members 236 and 239 enter the slots 278 and 280, respectively, in the plate 232. Continued pressure on the plate 232 causes the distal end portions of flexible legs 264 and 266 to slide off the sheer ends of ramp-like portions 314 and 316 thereby disposing their respective shoulders 268 and 270 into latching engagement with the sheer end surfaces of the ramp-like portions 314 and 316, respectively. Moreover, the distal end portions of flexible legs 282 and 284 slide off the sheer ends of respective ramp-like portions 327 in the aperture 326 thereby disposing their shoulders into latching engagement with the sheer end surfaces of the respective ramp-like portions 327.

As a result, the surface of plate 232 adjacent the plate 234 is seated on the terminating flat surface 320 of wall 318, the locating rib 321 is fully inserted into the locating slot 272 and the locating pins 265 are fully inserted into the respectively engaged, locating holes 263. Accordingly, when it is necessary to disassemble the plates 232 and 234, the distal end portions of flexible legs 282 and 284 are accessible from the opening of slotted aperture 326 in the outer surface of plate 234. Also, the distal end portions of flexible legs 264 and 266 are accessible from the open ends of slots 310 and 312, respectively, in the outer surface of plate 234. Consequently, the plate 232 may be unlatched to remove it from the plate 234 whereby the contact members 236 and 238 may be removed and, if necessary, replaced. Thus, the plate 232 is removably secured to the plate 234 by the flexible legs 264, 266, 282 and 284, respectively, without the requirement of separate fastening means, such as rivets or screws, for example.

Figures 19, 19A, 20, 20A:
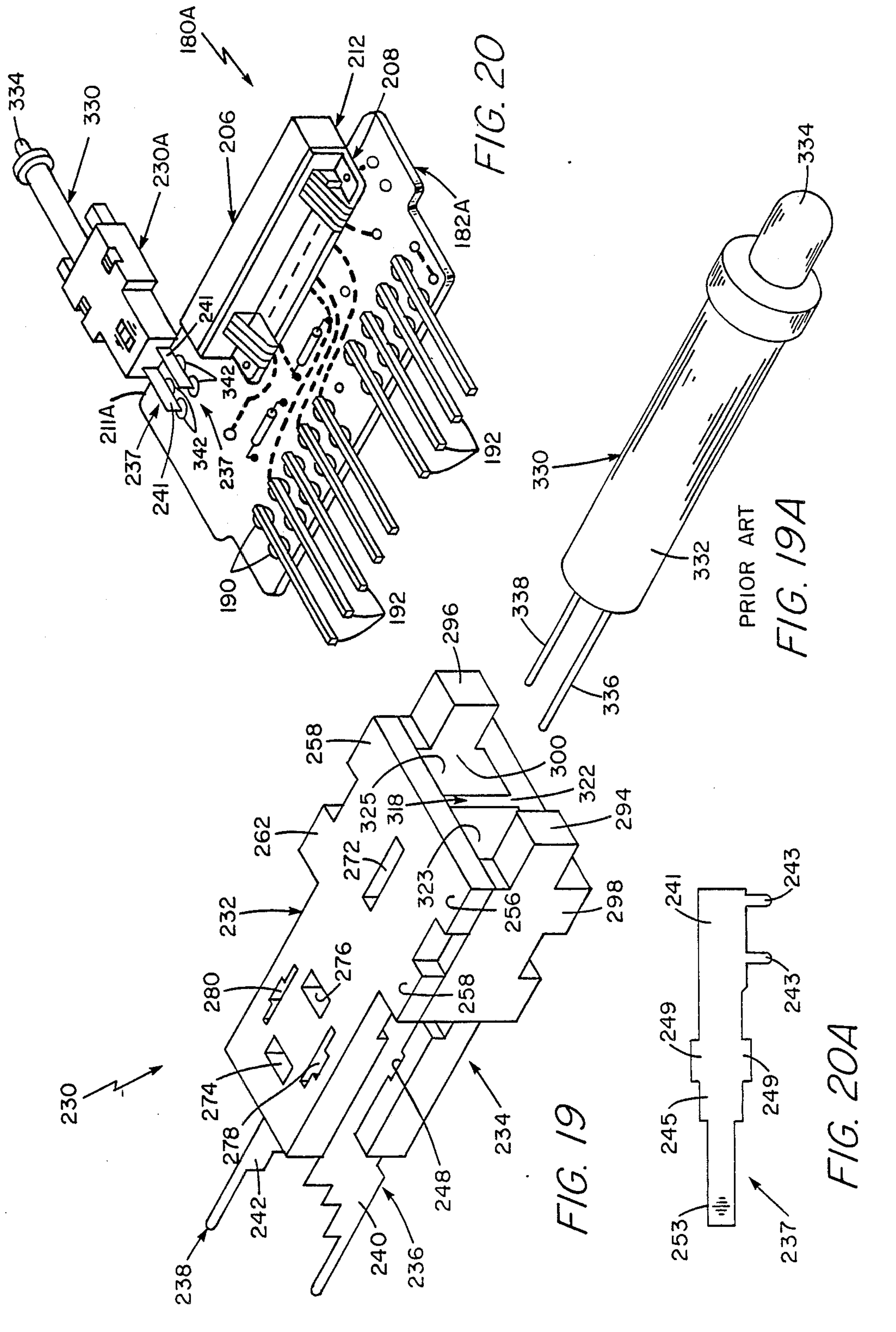
FIG. 19 is an isometric view of the lamp jack shown in FIG. 18 but assembled and disposed to receive a conventional lamp.
FIG. 19A is an isometric view of a conventional lamp suitable for use with the assembled lamp jack shown in FIG. 19.
FIG. 20 is a plan view of a printed circuit board assembly similar to the printed circuit board assembly shown in FIG. 13 but having assembled thereto a lamp jack similar to the lamp jack shown in FIG. 19 and the conventional lamp shown in FIG. 19A.
FIG. 20A is an elevational side view of an alternative contact for use with the lamp jack shown in FIG. 20.

As shown in FIG. 19, the assembled lamp jack 230 has opposing flat surfaces comprising the outer surfaces of plates 232 and 234, respectively. The tapered end portion 322 of wall 318 forms with the laterally spaced, inner wall surfaces of ledges 298 and 300, respective interposed slots 323 and 325. Adjacent the tapered opening of slots 323 and 325 the rippled end portions of the contact members shown in FIG. 18 are disposed within the assembled lamp jack 230 for electrically contacting relationship with inserted electrical conductors, such as the respective electrical leads or terminal wires 336 and 338 shown in FIG. 19A, for example. As shown in FIG. 194, a conventional lamp 330 suitable for use with the lamp jack 230 comprises the terminal wires 336 and 338 extending insulatingly from one end of a cylindrical body 332. The opposing end of body 332 supports a lens 334 through which light is transmitted when the lamp 330 is energized. Consequently, the respective terminal wires of lamp 336 and 338 may be inserted into the slots 323 and 325, respectively, to energize the lamp 330 when the respective terminal end portions 240 and 242 protruding from the opposing end of lamp jack 230 are connected to an electrical source.

As shown in FIG. 20, the lamp jack 230 may be embodied in a printed circuit board sub-assembly 180A which is similar to the printed circuit board sub-assembly 180 shown in FIG. 13. Accordingly, the sub-assembly 180A includes a printed circuit board 182A having extending from one end thereof a linear array of rigid terminal lugs 192 which have end portions fixedly secured, as by soldering, for example, to respective pairs of aligned eyelets or plated through-holes 190 disposed in an adjacent end portion of the board 182A. Also, the sub-assembly 180A includes a connector 206 having contacts connected to respective eyelets or plated through-holes, such as 204 shown in FIG. 13A, for example, which are disposed in an adjacent inset end portion of board 182A. Moreover, the connector 206 is disposed in recessed relationship with respect to an adjacent extreme end 211A of board 182A. The portion of board 182A adjacent the extreme end 211A has mounted therein two laterally spaced pairs of eyelets or plated through-holes 342. Each pair of through-holes 342 has fixedly secured thereto, as by soldering, for example, a respective terminal end portion 241 extending from lamp jack 230A.

Accordingly, the lamp jack 230 shown assembled in FIG. 19 may be disassembled, as described, in order to remove therefrom the contact members 236 and 238 shown in FIG. 18. The contact members 236 and 238 may be replaced by respective contact members similar to the contact member 237 shown in FIG. 20A. Contact member 237 is made of electrically conductive material, such as nickel alloy material, for example, and have a ripped end portion 253 which is integrally joined to a midportion 245. The midportion 245 is similar to the respective midportions 244 and 246 of contact members 236 and 238 shown in FIG. 18, and has projecting integrally from opposing sides thereof respective blade-like tabs 249. However, the contact member 253 differs from the contact members 236 and 238, respectively, by having its midportion 245 integrally joined to an enlarged terminal end portion 241. The terminal end portion 241 has projecting integrally therefrom a mutually spaced pair of terminal fingers 243 which are suitably located for insertion and soldering into respective plated through-holes 342 of an aligned pair. Thus, it may be seen that the contact members 236 and 238 having, as shown in FIG. 18, plug-in type terminal end portions 240 and 242, respectively, may be readily replaced by respective contact members having terminal end portions 241 suitable for soldering into an aligned pair of plated through-holes 342 in the printed circuit board 182A.

The lamp jack 330A thus secured to the extreme end portion 211A of board 182A extends outwardly therefrom for receiving conventional lamp 230 which is plugged into the lamp jack 230A. Each of the pairs of aligned through-holes 342 to which the respective terminal end portions 241 of lamp jack 230A are attached may be connected to respective printed circuit conductors insulatingly disposed in mutually spaced relationship in the extreme end portion of board 182A. These conductors may be electrically connected in the board 182A to respective plated through-holes 204 (FIG. 13A) which may be connected through respective contacts of connector 206 to the terminals of a module 30 such as shown in FIG. 17, for example. Thus, when a module 30 is plugged into connector 206 and is being used, as by having an electrical jack plug, such as plug 170 shown in FIG. 10, for example, inserted into an electrical jack in the module 30, the lamp 330 may be energized through the terminals of lamp jack 230 to illuminate and indicate that the module 30 is being used.

Accordingly, the subassembly 180A comprises a coplanar feedthrough channel for directing electrical signals from a connected module 30 (not shown) to the linear array of rigid terminals 192 and having a lamp jack 230 connected into the feedthrough channel to indicate when it is in use. The lamp jack 230 is self-latching to hold a pair of contact members insulatingly in operative spaced relationship with one another for receiving respective terminal wires of a lamp plugged into the self-latching jack 230. Consequently, separate hardware, such as fastening devices, for example, are not required for assembling the lamp jack 230 or for securing the lamp jack 230 to the printed circuit board 182A in subassembly 180A.

Figure 21B:
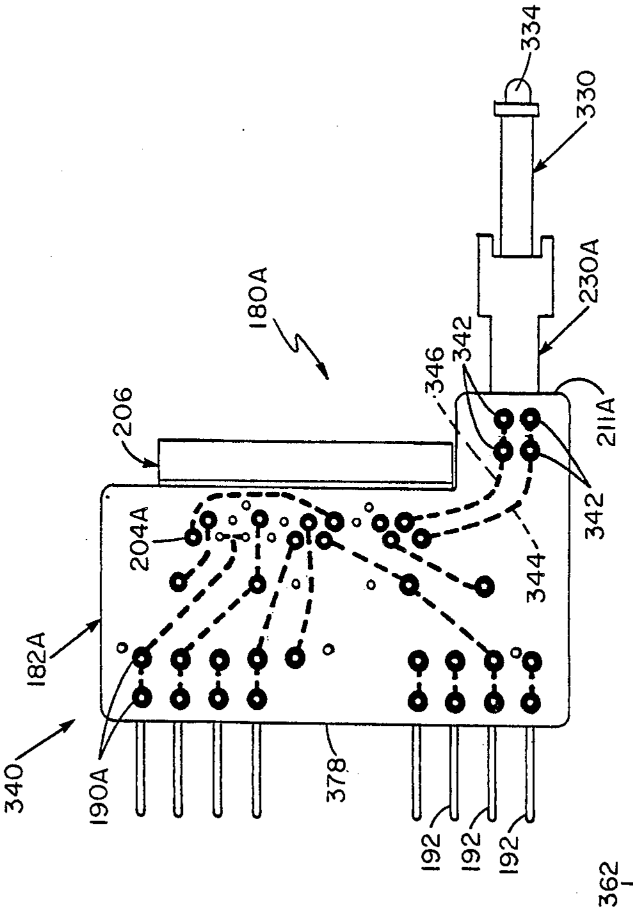
FIG. 21B is a plan view showing a printed circuit board assembly similar to that shown in FIG. 20 and disposed for mounting on the front side of the spring retainer bracket shown in FIG. 21.
Figure 21D:
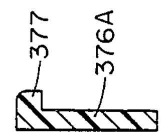
FIG. 21D is a fragmentary sectional view taken along the line 21D—21D shown in FIG. 21 and looking in the direction of the arrows.
Figure 21A:
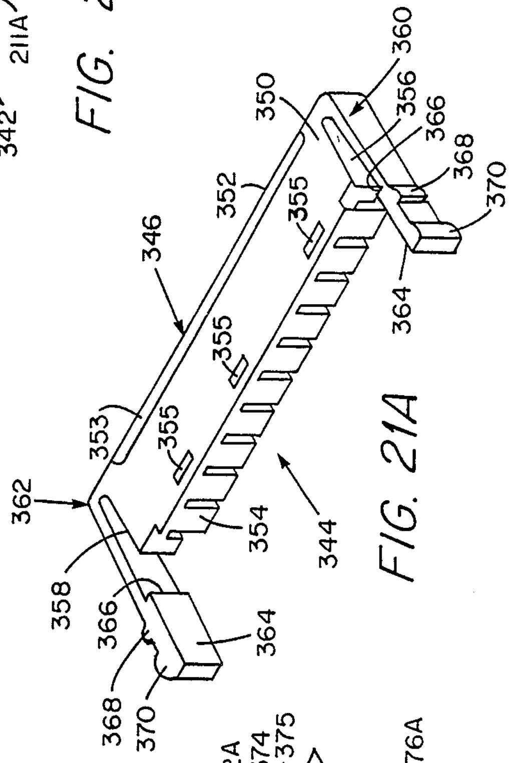
FIG. 21A is an isometric view showing the rear side of a spring retainer bracket suitable for use with the printed circuit board assemblies in FIGS. 17 and 20.
Figure 21:
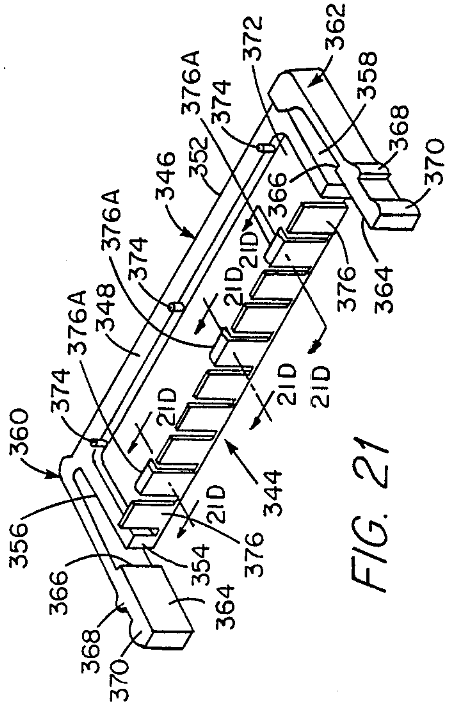
FIG. 21 is an isometric view showing the front side of the spring retainer bracket shown in FIG. 21A.
Figure 21C:
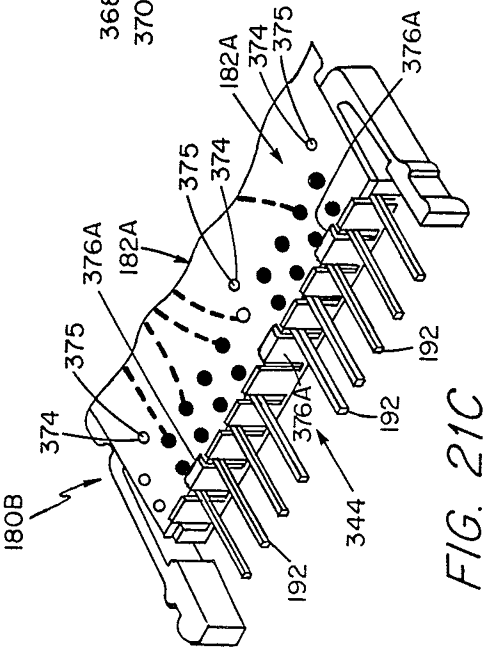
FIG. 21C is a fragmentary isometric view of the printed circuit board assembly shown in FIG. 21B mounted on the front side of the spring retainer bracket shown in FIG. 21A.

As demonstrated in FIGS. 21 and 21A–21C, the sub-assembly 180A shown in FIGS. 20 and 21B may be provided with a spring retainer base 344 (FIGS. 21 and 21A) to form a latchable and removable printed circuit board assembly 180B (FIG. 21C). The retainer base 344 may comprise a unitary integral structure made of dielectric material, such as molded plastic material, for example. Retainer base 344 includes an elongated plate-like body 346 having opposing broad surfaces 348 and 350, respectively, provided with similar rectangular configurations. The body 346 has opposing longitudinal side surfaces 352 and 354, respectively and opposing end surfaces 356 and 358, respectively, having widths which define the thickness of plate-like body 346. Longitudinal side surface 352 has an edge portion adjacent broad surface 350 provided with an elongated recessed area 353 which is intended for molding purposes. Also, broad surface 350 has a marginal portion adjacent longitudinal side surface 354 wherein respective open ends of three laterally spaced through-apertures 355 are disposed for molding purposes.

Protruding integrally from portions of end surfaces 356 and 358 adjacent the longitudinal side surface 352 are respective rounded proximal end portions of flexible arms 360 and 362, respectively, which flare outwardly of the end surfaces 356 and 358, respectively. The arms 360 and 362 have relatively thinner intermediate portions which extend in increasing laterally spaced relationship with the end surfaces 356 and 358, respectively, and extend slightly beyond the longitudinal side surface 354. Just beyond the longitudinal side surface 354, the intermediate portions of arms 360 and 362 are integrally joined to respective distal end portions thereof which are relatively thicker. The distal end portions of arms 360 and 362 are provided with respective inwardly extended portions which terminate in respective substantially flat surfaces 364 and which form respective right-angle shoulders 366 at the junctions with the intermediate portions of arms 360 and 362, respectively. The distal end portions of arms 360 and 362 are provided with respective outer surfaces which have respective ramp-like portions 368 protruding therefrom adjacent the junction with intermediate portions of arms 360 and 362, respectively. Also, the outer surfaces of the distal end portions have respective half-cylindrical knobs 370 protruding therefrom adjacent the terminal ends of arms 360 and 362, respectively.

The flexible arms 360 and 362 have side surfaces disposed substantially flush with the broad surface 350 and have opposing side portions extended beyond the broad surface 348 a distance substantially equal to the thickness of printed circuit board 182A in sub-assembly 180A. Broad surface 348 has disposed therein a rectangular recessed area 372 which extends from the longitudinal side surface 354 to adjacent the longitudinal side surface 352 and from adjacent the end surface 356 to adjacent the end surface 358. The longitudinal side of recessed area 372 adjacent the longitudinal side surface 352 has opposing end portions and a midportion from which respective locking pins 374 project integrally and extend beyond the broad surface 348 a distance substantially equal to the thickness of printed circuit board 182A in sub-assembly 180A. Locking pins 374 are suitably located and sized for having respective through-holes 375 in the printed circuit board 182A, as shown in FIG. 21C, press-fitted over the locking pins 374.

Extending integrally from the longitudinal side surface 354 of body 346 and beyond the broad surface 348 thereof is a linear array of laterally spaced teeth 376 having respective inner surfaces adjacent broad surface 348. The teeth 376 are resilient and have opposing inner and outer surfaces provided with substantially similar rectangular configurations. Between opposing ends of the recessed area 372 and adjacent end teeth 376 of the array as well as between adjacent teeth 376 of the array there is disposed respective slots 377 having terminating open ends and opposing closing ends. Each of the slots 377 has a suitable width for slidably receiving therein a respective terminal lug 192 projecting from an end 378 of the printed circuit board 182A in sub-assembly 180A.

A plurality of the teeth 376, which are designated as 376A, are resiliently biased to extend at a slight angle over the adjacent edge portion of recessed area 372, and, as shown in FIG. 21D, terminate at their distal ends in respective right-angle rims 377. As a result, the distance between the axial centerlines of locking pins 374 and the inner surfaces of teeth 376 is slightly less than the distances between the axial centerlines of through-holes 375 and the aligned portions of end 378 of the printed circuit board 182A. Consequently, when the terminal lugs 192 of sub-assembly 180A are inserted into respective slots 377 and the adjacent end 378 of printed circuit board 182A is brought into butting relationship with the inner surfaces of teeth 376A, it will be found that the through-holes 375 are slightly out of alignment with the respective locking pins 374. Therefore, the end 378 of printed circuit board 180A is pressed against the inner surfaces of teeth 376A to cause the teeth 376A to yield resiliently. As a result, the through-holes 375 are brought into alignment with the locking pins 374 and press-fitted over the pins 375 until the printed circuit board 182A rests on the broad surface 348. Thus, it may be seen that the portions of printed circuit board 182A between the locking pins 374 and the teeth 376 and 376A are firmly held against the broad surface 348 of body 346.

The resulting assembly 180B can be disassembled by inserting between the portion of board 182A adjacent the end 378 thereof and the broad surface 348 of body 346 a thin bladed end portion of a tool, such as a screwdriver, for example. As a result, the end 378 of board 182A will be forced away from broad surface 348 and will bear against the inner surfaces of the resiliently biased teeth 376A angled over the end 378 of installed board 182A. Consequently, the teeth 376A will yield resiliently and permit the locking pins 374 to be withdrawn slidably from the through-holes 375 in board 182A. Thus, the board 182A of assembly 180B may be converted back to the board 182A of sub-assembly 180A. Accordingly, it may be seen that the board 182A may be removably secured to the spring retainer base 344 for forming the assembly 180B without the need of separate fastener devices, such as screws or rivets, for example.

In FIGS. 22 and 22A–22E, there is shown a channelized jackfield assembly 380 comprising a linear array of laterally spaced modules 30 plugged into connectors 206 of respective coplanar subassemblies 180 of the type shown in FIG. 17. Each of the modules 30 and the connected subassembly 180 comprises a respective substantially planar feedthrough channel in the jackfield assembly 380. The linear array of modules 30 and respective coplanar subassemblies 180 are mounted in a jackfield and left side plates 384 having respective laterally extended shielding enclosure 382 which may include similar right portions 385 (only the right side plate 384 being shown in FIG. 22B due to similarities in structure). The right and left side plates 384 may have their respective edge portions bent at right-angles (not shown) to provide mounting flanges for the remaining plates of the enclosure 382. Accordingly, the enclosure 382 includes a front plate 386 having therein a right-angle knee portion 388 aligned with the respective laterally extended portions 385 of the right and left side plates 384. Also, the front plate 386 may have respective edge portions secured to the right-left side plates 384 by suitable fastening means, such as screws 387, for example. Furthermore, the enclosure 382 may include a back plate 390 having edge portions provided with suitably located mounting holes 391 through which fastening devices, such as screws 387, for example, may be passed for securing the back plate 390 to the right and left side plates 384.

The enclosure 382 also includes a bottom plate 392 having therein two rectangular openings 393 and 395 adjacent which there is disposed within the enclosure a dielectric board 394. Extending from the dielectric board 394 and insulatingly through the respective openings 393 and 395 are linear arrays of laterally spaced, rigid terminals 192 which protrude from the coplanar subassemblies 180, as shown in FIG. 17. Moreover, the enclosure 382 includes a top plate 396 having therein aperture means 397 for permitting the collars 48, 49 and 50 of respective modules 30 plugged into the connectors 206 of subassemblies 180 to protrude from the enclosure 382. Thus, it is apparent that the subassemblies 180 may be held in parallel spaced relationship with one another and against the dielectric board 398 by means of the right-angle knee portion 388 of front plate 386 bearing against the respective extreme ends 211 of the printed circuit boards 182 in the subassemblies 180.

Figure 22:
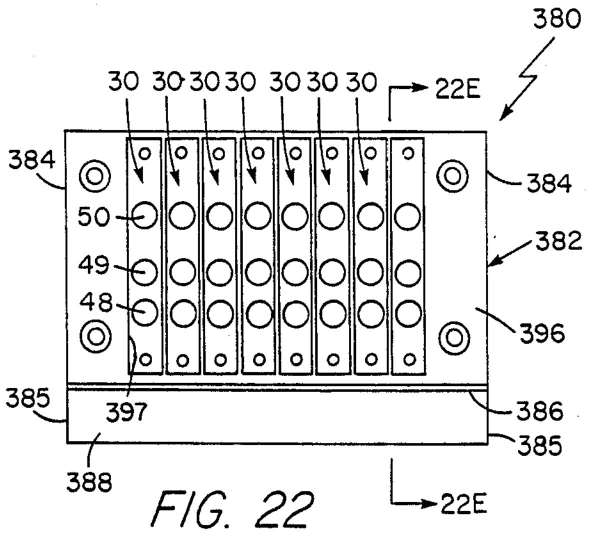
FIG. 22 is a top plan view of a jackfield assembly embodying printed circuit board assemblies similar to the assembly shown in FIG. 17.
Figure 22A:
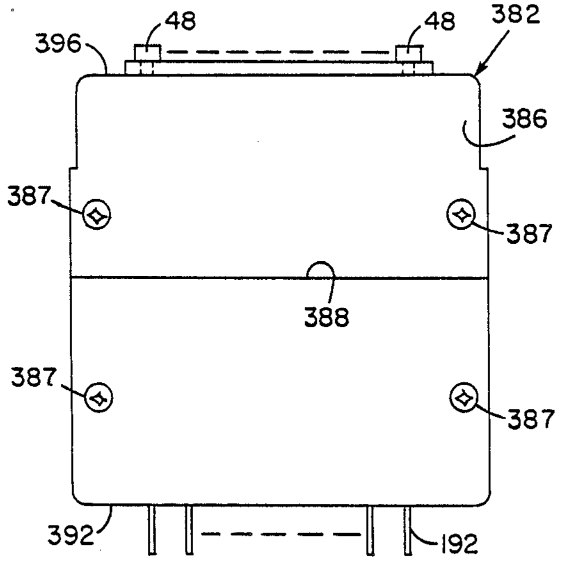
FIGS. 22A—22D are respective front side, bottom and rear views of the jackfield shown in FIG. 22.
Figure 22B:
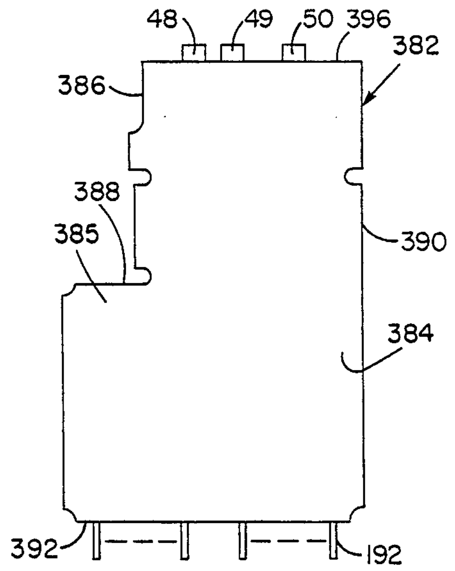
Figure 22C:
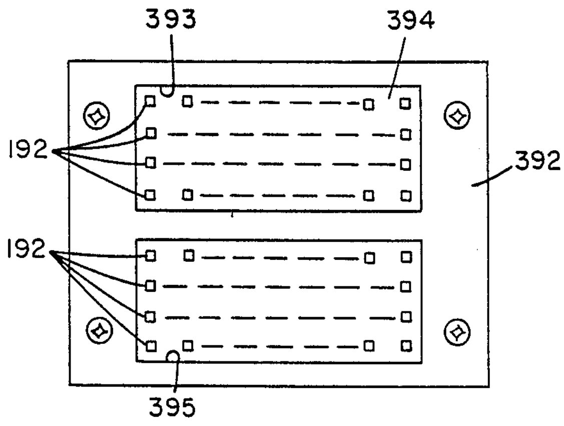
Figure 22D:
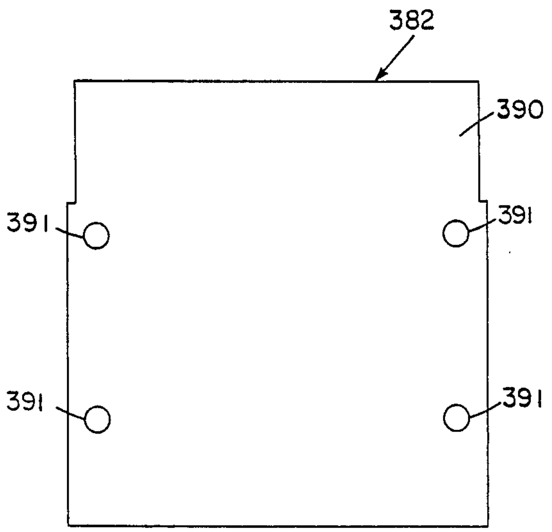
Figure 22E:
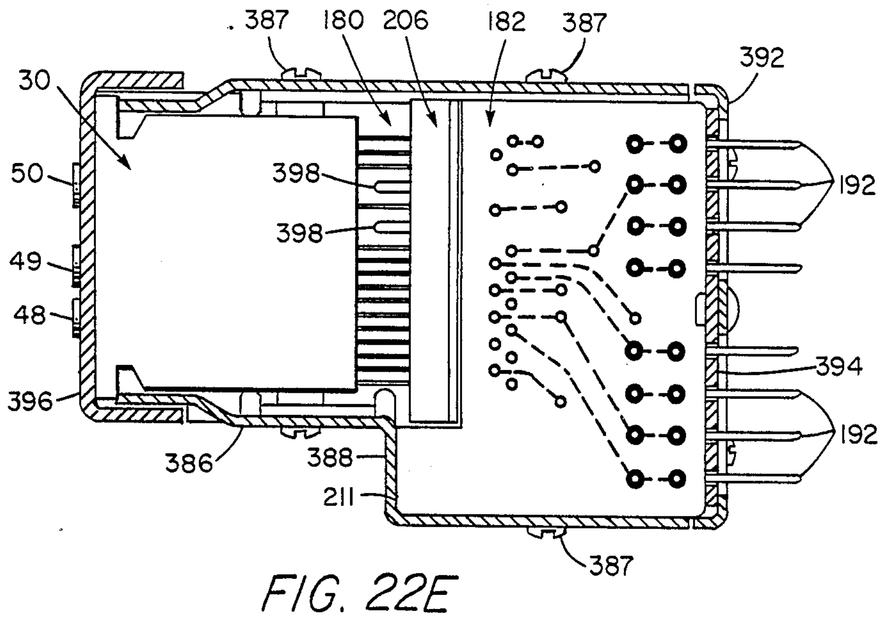
FIG. 22E is a cross-sectional view taken along the line 22E—22E shown in FIG. 22 and looking in the direction of the arrows.
Figure 22F:
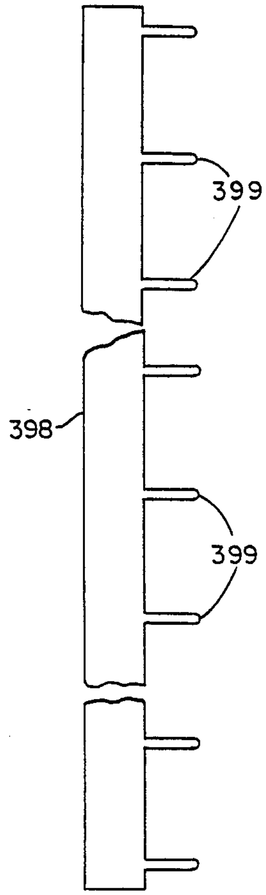
FIG. 22F is a side elevational view of the ground conductors shown in FIG. 22E.

Also, the jackfield assembly 380 may include a pair of daisy chain ground strips 398 made of electrically conductive material, such as nickel alloy material, for example. As shown in FIG. 22F each of the ground strips 399 comprises a daisy chain of terminal fingers 399 extending integrally from a common linking member of strip 398. The terminal fingers 399 are suitably spaced apart along the common linking member of strip 399 for being inserted into aligned openings in the connectors 206 of subassemblies 180. Thus, the inserted fingers 399 electrically connect the contacts in the engaged openings of the connectors 206 through the common linking member of the grounding strip 398 to electrical ground. Therefore, one of the grounding strips 398 may be used to connect each of the modules 30 in the linear array, for example, to a module ground; and the other of the grounding strips 398 may be used to connect each of the subassemblies 180, for example, to a system ground. Accordingly, each of the modules 30 in the linear array may be removed from the jackfield assembly 380 while the grounding strips 398 may remain plugged into respective openings in the connectors 206 of the subassemblies 180 still installed in the jackfield enclosure 382.

Figure 23:
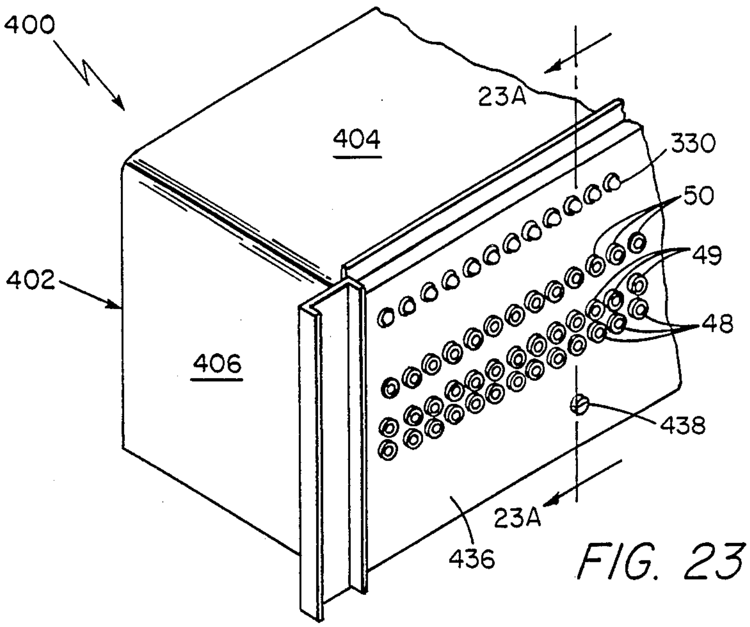
FIG. 23 is a fragmentary isometric view of another jackfield assembly.
Figure 23A:
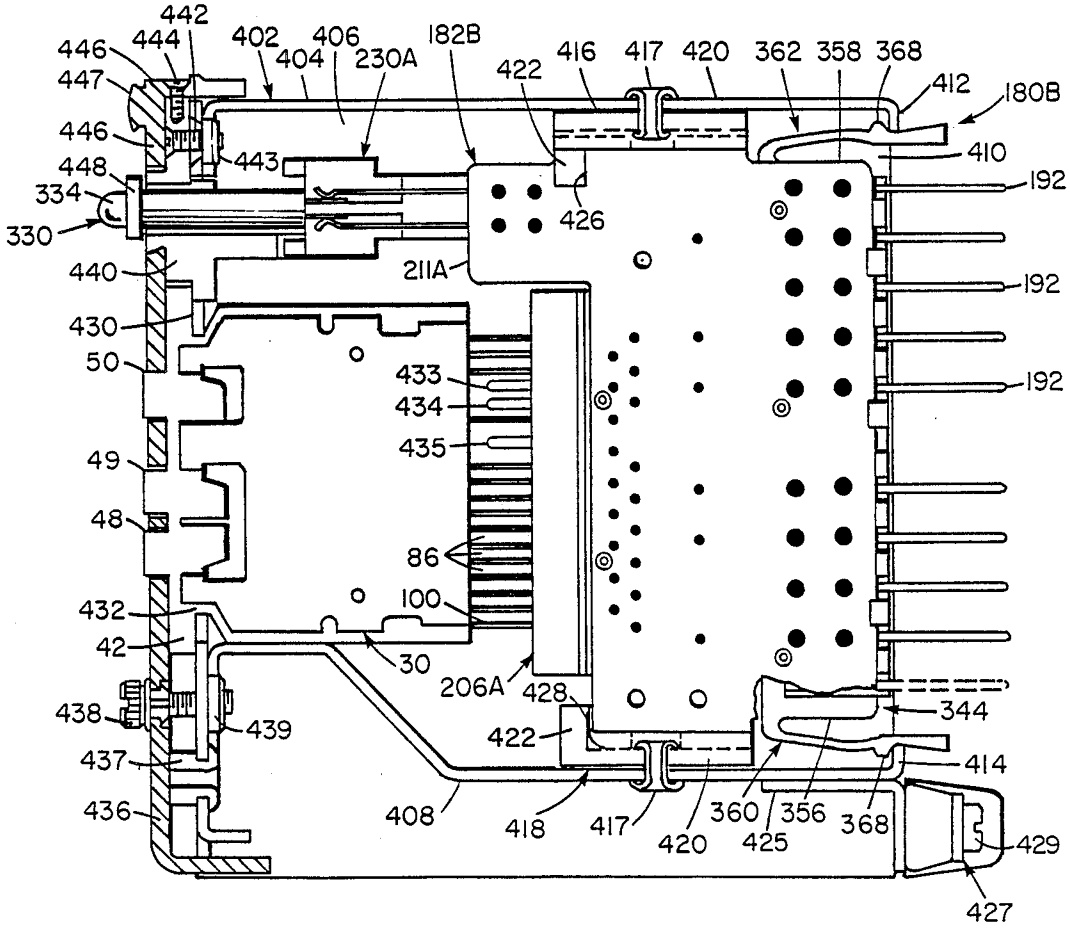
FIG. 23A is a cross-sectional view taken along the line 23A—23A shown in FIG. 23 and looking in the direction of the arrows.
Figure 23D:
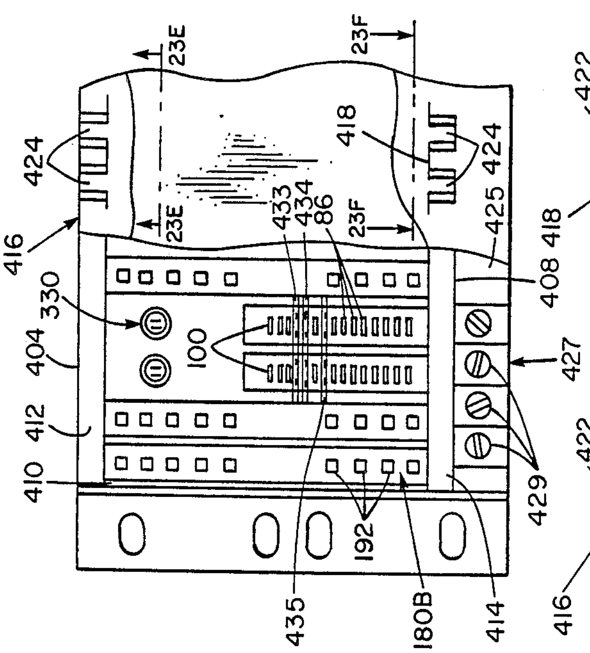
FIG. 23D is an elevational view of the rear of the jackfield assembly shown in FIG. 23 but with two printed circuit board assemblies removed.
Figure 23F:
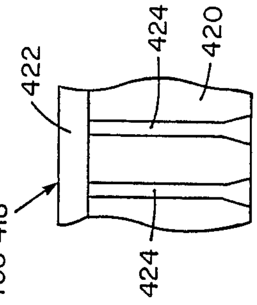
FIGS. 23E and 23F are fragmentary plan views taken along the lines 23E—23E and 23F—23F, respectively, shown in FIG. 23D and looking in the direction of the arrows.
Figure 23E:
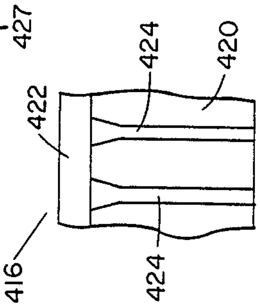

In FIGS. 23 and 23A, there is shown a jackfield assembly 400 comprising an electromagnetic shielding enclosure 402 made of electrically conductive material, such as aluminum having an anodized coating, for example. The enclosure 402 includes a sheet metal housing having an upper wall 404 integrally joined to respective opposing side walls 406 (only one being shown in FIG. 23) which are fixedly attached, as by welding, for example, to a lower wall 408 of the housing. Accordingly, the upper wall 404, respective opposing side walls 406 and lower wall 408 have adjacent end portions defining, as shown in FIG. 23D, a rear opening 410 of enclosure 402 having a generally rectangular configuration. The upper and lower walls 404 and 408 terminate at the rear opening 410 in right-angle lips, 412 and 414, respectively, which extend coplanarly into the opening 410. Thus, the lips 412 and 414 are disposed in spaced opposing relationship with one another in the plane of opening 410 and define opposing longitudinal sides thereof.

Extending in substantially parallel spaced relationship with the lips 412 and 414 are respective opposing portions of the upper and lower walls 404 and 408 having secured thereto, as by rivets or eyelets 417, for example, respective wafer guides 416 and 418. The wafer guides 416 and 418 are made of dielectric material, such as molded plastic material, for example, and comprise respective flat plates 420 having shoulder end portions 422 directed inwardly of the enclosure 402. As shown in FIGS. 23B, 23D, 23E and 23F, the plates 420 of wafer guides 416 and 418 have respective opposing surfaces provided, as by molding, for example, with respective linear arrays of laterally spaced channels 424. The channels 424 in each of the linear arrays are substantially rectilinear and are disposed in substantially parallel relationship with one another. Also, the channels 424 have respective tapered entrance portions which are open toward the rear opening 410 of enclosure 402 and respective opposing end portions terminating in the shoulder end portions 424 of the wafer guides. Moreover, each of the channels 424 in the plate 420 of wafer guide 416 is disposed in aligned registration with a respective channel 424 in the plate 420 of the wafer guide 418. Thus, in each pair of aligned channels 424 in the plates 420 of waver guides 416 and 418, respectively, there may be slidingly disposed a respective subassembly 180B of the type shown in FIG. 21C. Accordingly, there may be installed through the rear opening 410 and between the respective wafer guides 416 and 418 a linear array of laterally spaced subassemblies 180B which are substantially parallel with one another.

As shown in FIGS. 23A and 23B, each of the subassemblies 180B includes a self-latching lamp jack 230A extending from an extreme forward end 211A of a printed circuit board 182B. Between the extreme forward end 211A and an adjacent side edge of circuit board 182B, there is a recessed shoulder 426, as may be provided by removing a corner portion of the circuit board 182A shown in FIG. 21B, for example. Also, each of the subassemblies 180B includes a self-latching connector 206A which is recessed from the extreme forward end 211A of circuit board 182B and extends from an inset end portion thereof. The inset end portion of circuit board 182B forms with an adjacent side edge thereof a recessed shoulder 428 which is substantially coplanar with the shoulder 426. Thus, as shown in FIG.

23B when a subassembly 180B is slidably inserted into a respective pair of aligned channels 424 in the wafer guides 416 and 418, respectively, it may be pressed inward of enclosure 402 until the shoulders 426 and 428 of the printed circuit 182B are brought into butting relationship with the respective shoulders 422 of the wafer guides 416 and 418.

Each of the subassemblies 180B includes a retainer base 344 having opposing sides 356 and 358 from which respective flexible arms 360 and 362 flare outwardly. Accordingly, when the attach printed circuit board 182B is slidably inserted into a pair of aligned channels 424 in the wafer guides 416 and 418, respectively, and pressed into enclosure 402, as described, the outer surfaces of flexible arms 360 and 362 are brought into rubbing engagement with the right-angle lips 412 and 414, respectively, and are pressed inwardly toward one another. As a result, the lips 412 and 414 slide up the sloped surfaces of respective ramp-like portions 368 on the outer surfaces of flexible arms 360 and 362. The lips 412 and 414 slide off the sheer ends of the ramp-like portions 368 and into latching engagement with the sheer end surfaces of the ramp-like portions 368. Accordingly, each of the subassemblies 180B is removably secured in the enclosure 402 by being locked between the shoulders end portions 422 of the wafer guides 416 and 418, respectively, and the lips 412 and 414 latchingly engaging the sheer end surfaces of the ramp-like portions 368 on flexible arms 360 and 362, respectively. When it is necessary to remove one of the subassemblies 180B, the distal end portions of flexible arms 360 and 362, respectively, may be grasped and pressed toward one another while pulling gently on the subassembly 180B. Consequently, the flexible arms 360 and 362 flex inwardly toward one another and permit the ramp-like portions 368 on the outer surfaces of the arms to clear the opposing lips 412 and 414. Thus, the subassembly 180B may be withdrawn from enclosure 402 by sliding it out of the engaged channels 424 in wafer guides 416 and 418, respectively.

Figure 23C:
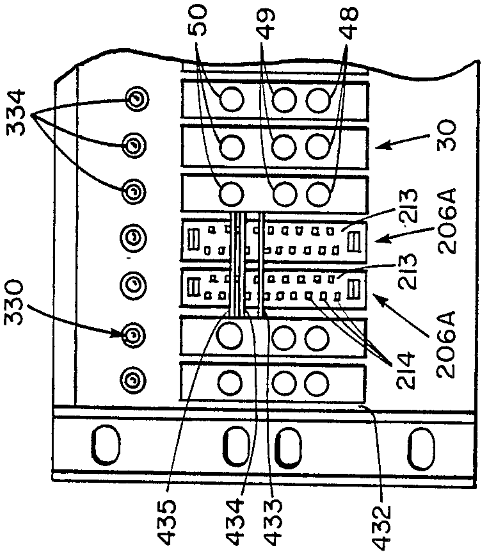
FIG. 23C is an elevational view of the front of the jackfield assembly shown in FIG. 23 but with the front panel and two modules removed.

The upper wall 404, respective opposing side walls 406 and the lower wall 408 of enclosure 402 have respective other end portions attached, as by welding, for example, to a front support plate 430. The front support plate 430 defines a front opening 432 of enclosure 402 having, as shown in FIG. 23C, a generally rectangular configuration similar to the configuration of rear opening 410 shown in FIG. 23D. Therefore, with only the linear array of laterally spaced subassemblies 180B installed within enclosure 402 through the rear opening 410, as described, the respective connectors 206A of the installed subassemblies 180B are accessible through the front opening 432. Accordingly, at this stage of assembly, there is installed through the front opening 432 respective ground strips 433, 434 and 435 which are similar to the ground strip 398 shown in FIG. 22F. Thus, each of the ground strips 433, 434 and 435, as shown in FIG. 23C, has a respective linking member from which a respective plurality of laterally spaced fingers project for insertion into aligned apertures 214 in the forward surfaces 213 of the respective connectors 206A. Preferably, the apertures 214 interconnected by a respective ground strip 433, 434 and 435 are similarly located in the forward surfaces 213 of the connectors 206A for purposes of uniformity and accuracy.

As shown in FIG. 23A, the lower wall 408 of enclosure 402 has adjacent the rear opening 410 thereof an end portion attached, as by welding, for example, to a rear plate 425 of assembly 400. The rear plate 425 has a depending right-angle portion supporting a terminal block 427 adjacent the rear opening 410 of enclosure 402. As shown more clearly in FIG. 23D, the terminal block 427 is provided with a plurality of mutually insulated, terminal screws 429 which there may be electrically connected respective wire conductors (not shown), such as electrical ground conductors or negative voltage conductors, for examples. The terminal screws 429 are electrically connected through respective conductors (not shown) which extend into the enclosure 402 for electrical connection to one or more of the strips 433, 434 and 435, respectively. Thus, the strips 433, 434 and 435 may apply a negative voltage or an electrical ground potential through the contacts in the engaged apertures 214 of the respective connectors 206A to connecting conductors in the printed circuit boards 182B of the respective subassemblies 180B.

After installation of the strips 433, 434 and 435, there is installed through the front opening 432 and in the enclosure 402 a linear array of laterally spaced modules 30 of the type shown in FIG. 1. Each of the modules 30 has its terminal end portions 86 and 100 disposed in lateral spaced relationship with the strips 433, 434 and 435, respectively, and plugged into respective apertures 214 of an aligned connector 206A of a coplanar subassembly 180B. Thus, each of the modules 30 and the coplanar subassembly 180B constitutes a respective planar feedthrough channel extending from front opening 432 of jackfield assembly 400 to the opposing rear opening 410 thereof. Accordingly, when a module 30 of the linear array has a jack plug inserted into one of its collars 48, 49 and 50, as shown in FIG. 11, for example, electrical signals may be conveyed from the module plugged into one end of the coplanar subassembly 180B to the terminal lugs 192 projecting from the other end of the subassembly 180B.

Insertion of the modules 30 into the enclosure 402 is limited by the mounting brackets 42 of the modules having opposing end portions extended beyond respective longitudinal sides of the front opening 432. The opposing end portions of the mounting brackets 42 are disposed between respective aligned portions of the front support plate 430 and a front panel 436 which is spaced therefrom by interposed portions of a dielectric spacer 437 extended outwardly from the front support plate 430. Modules 30 of the linear array have respective collars 48, 49 and 50 protruding through aligned apertures in the front panel 436 which retains the modules 30 in laterally spaced relationship with one another and within the enclosure 402. The front panel 436 is held against the dielectric spacer 437 by a pair of knurled thumb screws 438 which are suitably spaced apart and threadingly engage respective pem nuts 439 supported on the far surface of front support plate 430. Thus, by loosening the pair of thumb screws 438, the front panel 436 may be removed to permit removal of one or more of the modules 30 from enclosure 402. As shown in FIG. 23C, when two modules 30 are removed from the enclosure 402, the interposed portions of strips 433, 434 and 435 remain connected to the formerly aligned connectors 206A of the respective subassemblies 180B. Thus, removal of the modules 30 does not disturb the strips 433, 434 and 435, respectively or the formerly aligned connectors 206A of formerly coplanar subassemblies 180B.

The front support plate 430 has spaced above the front opening 432 a coextensive opening wherein a longitudinal proximal portion of a lamp support bar 440 is disposed. The proximal portion of lamp support bar 440 is fixedly secured, as by a plurality of screws 442 threadingly engaging aligned pem nuts 443, for example, to a portion of front support plate 430 adjacent the upper wall 404 of enclosure 402. Also, the proximal portion of lamp support bar 440 may have fixedly secured thereto, as by a plurality of screws 444, for example, an upper front plate 446 provided with a designation strip 447 which extends along the length of lamp support bar 440. The lamp support bar 440 has disposed therein along its length a plurality of laterally spaced holes wherein respective indicator lamps 330 may be inserted. Each of the holes in lamp support bar 440 and the indicator lamp 330 inserted therein are aligned with a respective one of the modules 30 in the front opening 432 of enclosure 402.

The lamp support bar 440 extends in cantilever fashion from the inner surface of front support plate 430 and has a longitudinal distal portion disposed in alignment with the respective lamp jacks 230A. The lamp jacks 230A extend from extreme ends 211A of the printed circuit boards 182B of aligned subassemblies 180B which are installed through the rear opening 410 of enclosure 402. Thus, when a lamp 330 is fully inserted into a hole in lamp support bar 440, an annular flange 448 adjacent the lens 334 of the lamp abuts the rim of the hole and the terminal leads or wires of the lamp 330 are plugged into the aligned lamp jacks 230A. As shown in FIG. 23D, when one or more of the subassemblies 180B are removed from the enclosure 402, as described, the strips 433, 434 and 435 remain plugged into the connectors 206A of the still installed subassemblies 180B and the lamp 330 remains inserted in the engaged hole in lamp support bar 440. Accordingly, removal of one or more of the subassemblies 180B does not disturb the electrical connections of the strips 433, 434 and 435, respectively or the seating of lamp 330.

Thus, there is disclosed herein a jackfield assembly 400 provided with an enclosure 402 having front and rear openings 432 and 410, respectively. Printed circuit board subassemblies 180B are readily installed and removed through the rear opening 410 of the enclosure 402. Modules 30 are readily installed and removed through the front opening 432 of the enclosure. The modules 30 are provided with self-latching components so that the modules 30 may be readily disassembled and re-assembled without the need of extraneous hardware, such as fastening devices, for example. Also, the subassemblies 180B are provided with self-latching components, such as the connector 206A and the lamp jack 230A, for example, which provide ready means for disassembly and re-assembly. Moreover, each of the subassemblies 180B is provided with a readily assembled spring retainer base 344 having flexible latching means for removably securing the subassemblies 180B in the enclosure 402 of the jackfield assembly 400.

From the foregoing, it will be apparent that all of the objectives have been achieved by the structures and methods described herein. It also will be apparent, however, that various changes may be made by those skilled in the art without departing from the spirit of the inventive subject matter, as expressed in the appended claims. It is to be understood, therefore, that all matter shown and described is to be interpreted as illustrative and not in a limiting sense.

What is claimed is:

1. A jack assembly comprising:

a printed circuit board having a forward facing right angle connector;

a jack module positioned coplanar with said printed circuit board and being removably connected to said right angle connector, said jack module having forward facing plug receiving sleeves and a plurality of electrical circuits activated by insertion or removal of said plugs;

a lamp jack comprising:

(a) an elongated dielectric body including first and second dielectric plate means for forming respective opposing walls of said body and for forming in one end portion of said body a longitudinally extending pair of lamp conductor-receiving cavities, said first plate means including dielectric barrier means disposed between said cavities for electrically insulating said cavities from one another;

(b) said first and second plate means having respective first and second portions aligned with one another and provided with respective integral first and second latching means for removably securing said first and second plate means to one another;

(c) first and second mutually insulated, electrical contact members having a contacting end portion disposed in a respective one of said lamp conductor-receiving cavities; and means for connecting said lamp jack to said printed circuit above said jack module, said connecting means comprising a solder joint between said electrical Contact members and said printed circuit board wherein said elongated dielectric body is horizontally suspended above said jack module.

2. A jack assembly as set forth in claim 1 wherein said first and second plate means have respective first and second inner surfaces disposed adjacent one another, said dielectric barrier means protruding integrally from an axial portion of said first inner surface and terminating in distal surface means disposed in abutting relationship with said second plate means for spacing the inner surface of said second plate means a predetermined distance from the inner surface of said first plate means.

3. A jack assembly as set forth in claim 2 wherein said dielectric barrier means includes a longitudinally extending plateau having a tapered end portion disposed adjacent one end of said body.

4. A jack assembly as set forth in claim 1 wherein said first latching means includes a first sloped surface means disposed for causing resilient movement of said second latching means and terminating in a projecting shoulder means for engaging said second latching means.

5. A jack assembly as set forth in claim 4 wherein said second latching means includes second sloped surface means disposed for rubbing engagement with said first sloped surface means and terminating in a resiliently biased shoulder means for springing into latching engagement with said projecting shoulder means.

6. A lamp jack assembly comprising:

an elongated dielectric body including first and second dielectric plates having respective first and second inner surfaces disposed in spaced opposing relationship with one another and including dielectric wall means extended from said first inner surface to said second inner surface for forming adjacent one end of said body a longitudinally extending pair of mutually insulated, lamp conductor-receiving cavities;

said first plate having a plurality of mutually spaced portions provided with respective integral first latching means for removably securing said plates to one another;

said second plate having a plurality of mutually spaced portions, each being aligned with a respective first latching means and provided with an integral second latching means for engaging the respectively aligned first latching means;

first and second electrical contact members disposed in mutually insulated relationship between said first and second plates and extended substantially longitudinally of said body, each of said first and second electrical contact members having a lamp conductor-engageable end portion disposed in a respective one of said lamp conductor-receiving cavities;

said dielectric wall means including a longitudinally extending plateau projected integrally from am axial portion of said first inner surface between said longitudinally extending pair of lamp conductor-receiving cavities and terminated in a plateau distal surface abutting said second inner surface of said second plate; and said dielectric wall means including first and second ledges projected integrally from respective longitudinal marginal portions of said first inner surface disposed on respective opposing sides of said plateau and laterally spaced therefrom, each of said longitudinally extending pair of lamp conductor-receiving cavities being disposed between a respective one of said ledges and said plateau, said first and second ledges being terminated in respective first and second ledge distal surfaces disposed substantially coplanar with said plateau distal surface.

7. A lamp jack as set forth in claim 6 wherein said longitudinally extending plateau has tapered end portion means disposed adjacent said one end of said body for providing entry guidance into said pair of lamp conductor-receiving cavities.

8. A lamp jack assembly as set forth in claim 7 wherein said first and second electrical contact members are substantially blade-like and are disposed edgewise along respective opposing sides of said longitudinally extending plateau.

* * * * *